United States Patent
Saito et al.

(10) Patent No.: US 10,432,084 B2
(45) Date of Patent: Oct. 1, 2019

(54) POWER SUPPLY APPARATUS AND IMAGE FORMING APPARATUS CONTROLLING SWITCHING ELEMENTS BASED ON DETECTION OF A MALFUNCTION

(71) Applicant: CANON KABUSHIKI KAISHA, Tokyo (JP)

(72) Inventors: Yusuke Saito, Susono (JP); Hiroki Asano, Kawasaki (JP); Yasuhiro Shimura, Yokohama (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/030,499

(22) Filed: Jul. 9, 2018

(65) Prior Publication Data

US 2019/0020268 A1    Jan. 17, 2019

(30) Foreign Application Priority Data

Jul. 14, 2017   (JP) ................. 2017-138209

(51) Int. Cl.
*H02M 1/38*    (2007.01)
*G06K 15/00*   (2006.01)
(Continued)

(52) U.S. Cl.
CPC ............. *H02M 1/38* (2013.01); *G03G 15/80* (2013.01); *G06K 15/12* (2013.01); *G06K 15/406* (2013.01); *G06K 15/409* (2013.01); *H02H 1/0007* (2013.01); *H02H 3/021* (2013.01); *H02H 3/05* (2013.01); *H02H 3/08* (2013.01); *H02H 3/093* (2013.01); *H02H 7/20* (2013.01); *H02M 1/32* (2013.01); *H02M 1/36* (2013.01); *H02M 3/33569* (2013.01); *H03K 17/0822* (2013.01); *H02M 2001/0009* (2013.01); *H02M 2001/0058* (2013.01); *H02M 2001/346* (2013.01)

(58) Field of Classification Search
None
See application file for complete search history.

(56) References Cited

U.S. PATENT DOCUMENTS 9,823,617 B2    11/2017   Shimura
9,897,964 B2     2/2018   Shimura
(Continued)

FOREIGN PATENT DOCUMENTS

JP    2017-17846    1/2017

OTHER PUBLICATIONS

U.S. Appl. No. 15/958,344 filed Apr. 20, 2018, by Yasuhiro Shimura et al.
(Continued)

*Primary Examiner* — Andrew H Lam
(74) *Attorney, Agent, or Firm* — Venable LLP

(57) ABSTRACT

The switching power supply apparatus including a transformer includes a detection unit configured to detect that the power supply apparatus malfunctions and a first holding unit configured to turn off a first switching element and holds the first switching element at turn-off condition, and when the detection unit detects that malfunction occurs, the first holding unit releases the first switching element from the turn-off condition at a timing when the control unit turns on the second switching element by a second control signal.

17 Claims, 10 Drawing Sheets

(51) Int. Cl.
  *G06K 15/12* (2006.01)
  *H02M 3/335* (2006.01)
  *H02M 1/36* (2007.01)
  *H02H 3/02* (2006.01)
  *H02H 3/05* (2006.01)
  *H02H 3/093* (2006.01)
  *H03K 17/082* (2006.01)
  *G03G 15/00* (2006.01)
  *H02H 1/00* (2006.01)
  *H02M 1/32* (2007.01)
  *H02H 3/08* (2006.01)
  *H02H 7/20* (2006.01)
  *H02M 1/00* (2006.01)
  *H02M 1/34* (2007.01)

(56) References Cited

U.S. PATENT DOCUMENTS

| | | |
|---|---|---|
| 9,966,865 B2 | 5/2018 | Shimura |
| 2015/0249397 A1* | 9/2015 | Ogasawara ......... H02M 1/4266 |
| | | 315/200 R |
| 2017/0005585 A1* | 1/2017 | Shimura ........... H02M 3/33569 |
| 2017/0176918 A1 | 6/2017 | Shimura |
| 2018/0212508 A1 | 7/2018 | Kobayashi |

OTHER PUBLICATIONS

U.S. Appl. No. 16/058,280 filed Aug. 8, 2018, by Hiroki Asano et al.
U.S. Appl. No. 16/057,636 filed Aug. 7, 2018, by Yasuhiro Shimura et al.
U.S. Appl. No. 16/058,289 filed Aug. 8, 2018, by Yasuhiro Shimura et al.

* cited by examiner

FIG. 1A
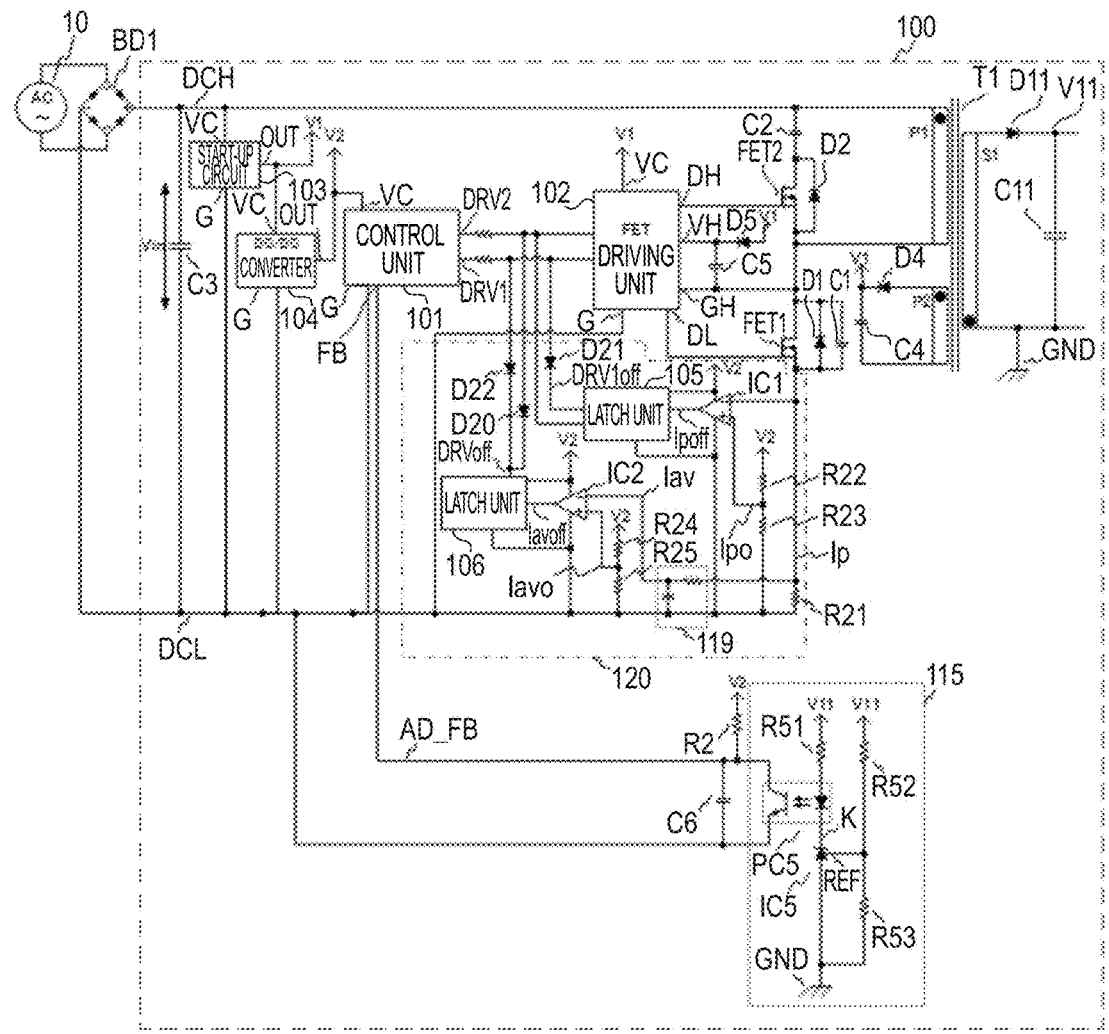
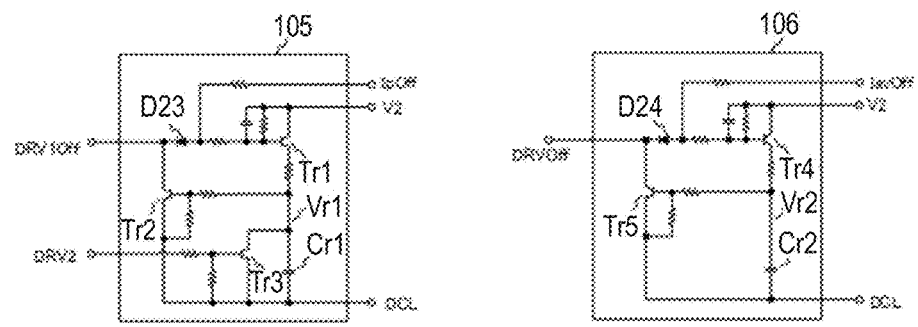
FIG. 1B          FIG. 1C

FIG. 6A
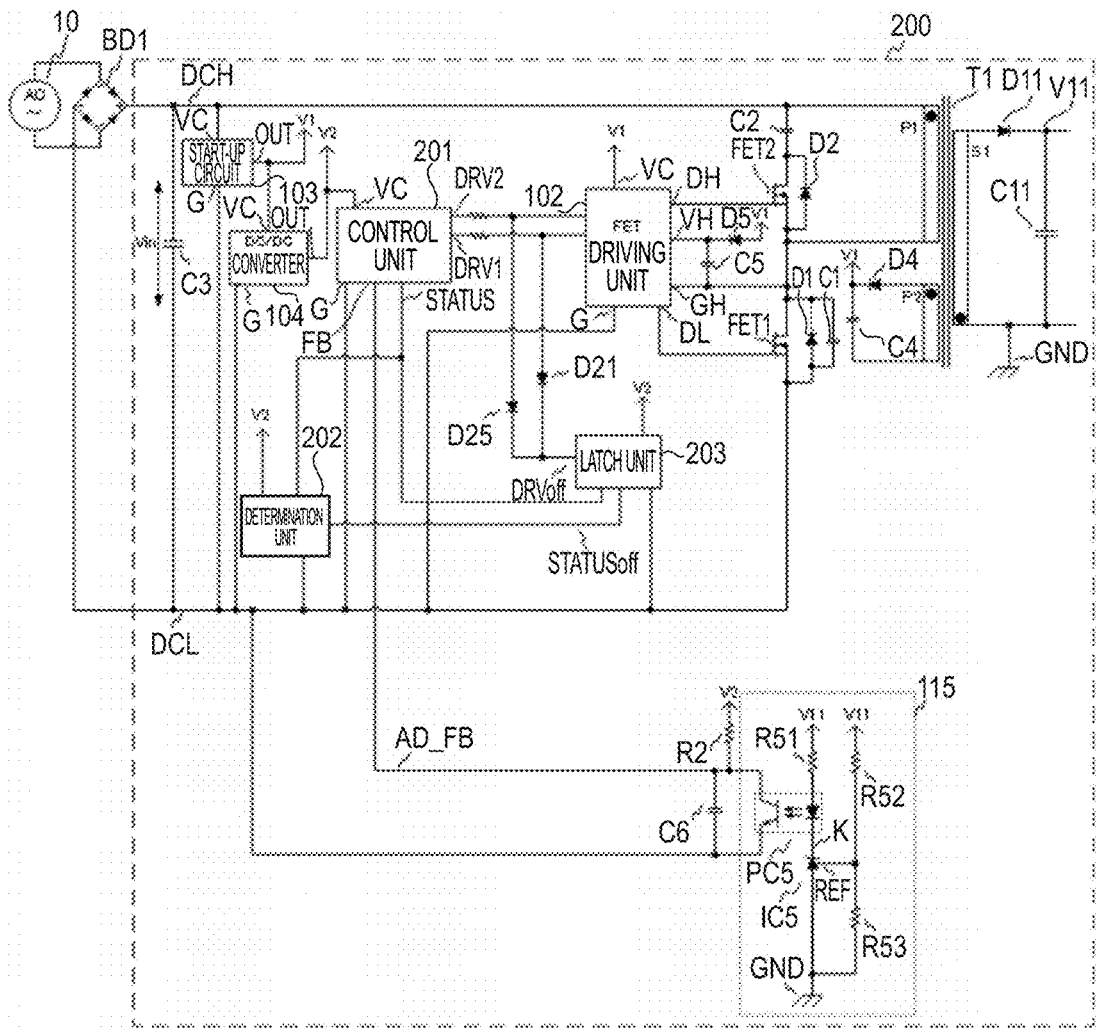
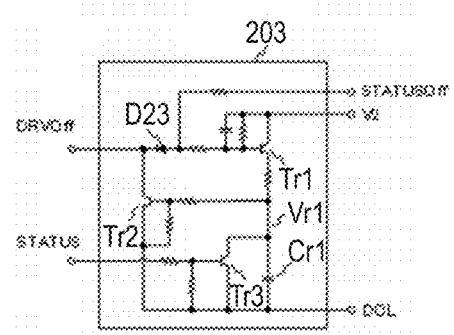
FIG. 6B
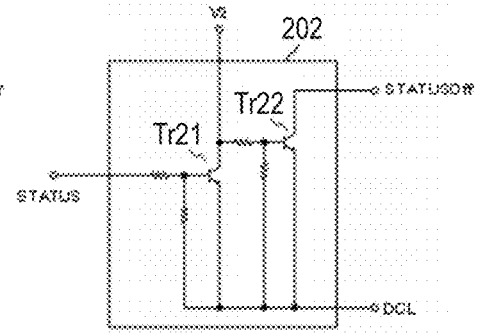
FIG. 6C

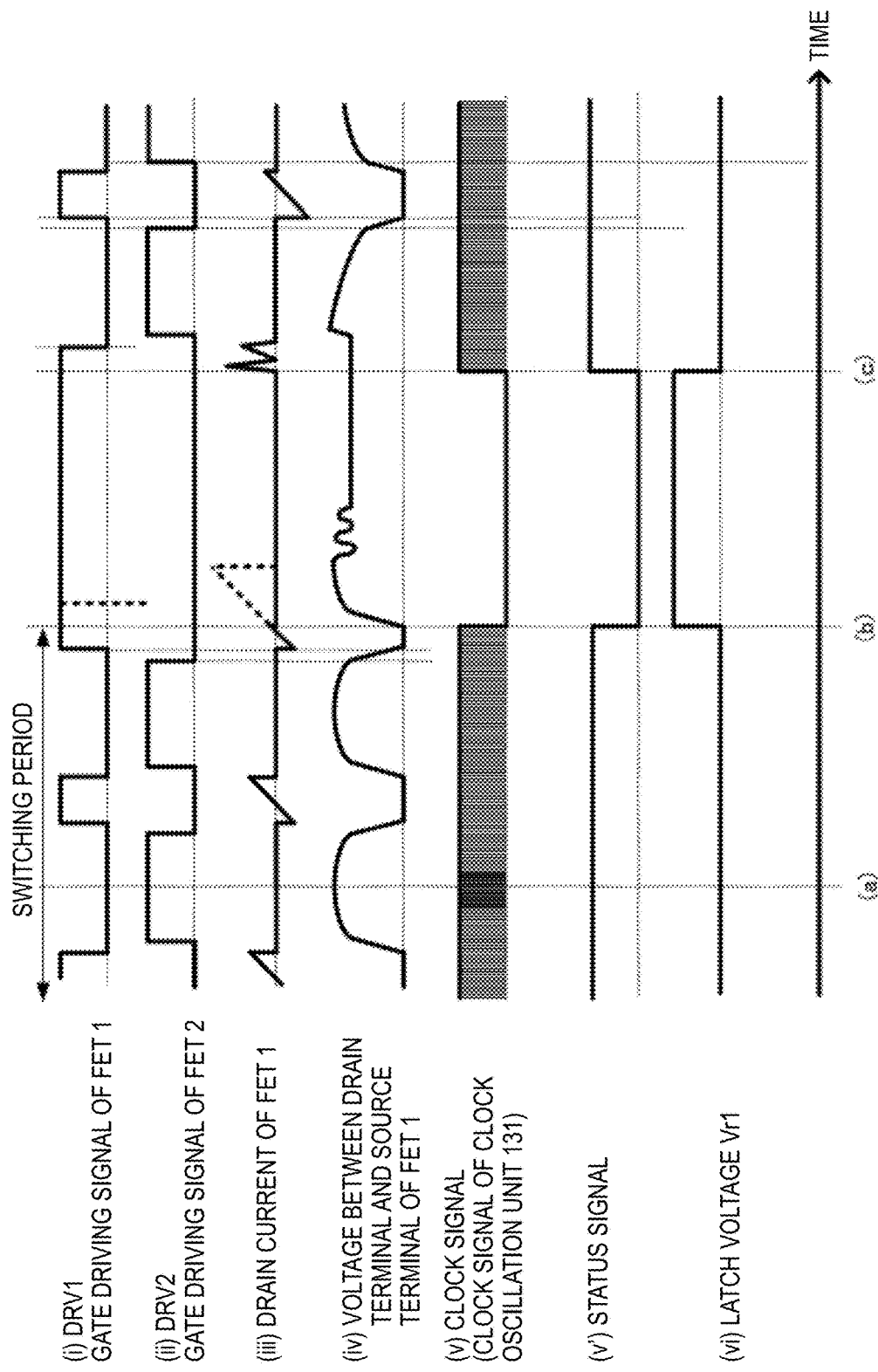

POWER SUPPLY APPARATUS AND IMAGE FORMING APPARATUS CONTROLLING SWITCHING ELEMENTS BASED ON DETECTION OF A MALFUNCTION

BACKGROUND OF THE INVENTION

Field of the Invention

The present invention relates to a power supply apparatus and an image forming apparatus, and particularly to a power supply apparatus including a digital control unit that operates according to a clock signal.

Description of the Related Art

In a switching power supply apparatus, which converts AC voltage input, for example, from a commercial power supply into DC voltage, it is required to improve the efficiency of the switching power supply apparatus for reduction in consumed power. An image forming apparatus, such as a laser beam printer (LBP), in particular, has a wide in-use load range from a heavy load to a light load. Therefore, a switching power supply apparatus incorporated in an image forming apparatus is required to have good power supply efficiency over a wide load range. Japanese Patent Application Laid-Open No. 2017-017846, which describes a switching power supply apparatus that is efficient over a wide load range from a heavy load to a light load, proposes a method using digital control performed by a microprocessor. The efficiency of the switching power supply apparatus is expressed by the ratio between the power supplied to the switching power supply apparatus and the power output by the switching power supply apparatus.

The control unit of the switching power supply apparatus is affected by noise in some cases. For example, if the control unit stops operating due to noise, and a switching element is held in the turn-on condition, overcurrent flows, and an overcurrent protection circuit operates in some cases. As a result, when the switching power supply apparatus stops outputting power and no power is therefore supplied to the load, the load stops operating, resulting in a problem of a decrease in usability.

SUMMARY OF THE INVENTION

According to an aspect of the present invention, a circuit can be protected from overcurrent even when a control unit stops operating, and output of power supply voltage to a load is not terminated.

Another aspect of the present invention relates to a power supply apparatus including a transformer including a primary winding and a secondary winding, a first switching element connected in series to the primary winding of the transformer, a second switching element connected in parallel to the primary winding of the transformer, a capacitor connected in series to the second switching element and connected in parallel along with the second switching element to the primary winding of the transformer, a feedback unit configured to output information according to voltage induced in the secondary winding of the transformer, a control unit configured to control turn-on or turn-off of the first switching element by a first control signal and control turn-on or turn-off of the second switching element by a second control signal based on the information output from the feedback unit, the control unit configured to perform a switching operation of alternate turn-on and turn-off of the first switching element and the second switching element before and after a dead time in which the first switching element and the second switching element are both turned off, a detection unit configured to detect that the power supply apparatus malfunctions; and a first holding unit configured to turn off the first switching element and holds the first switching element at a turn-off condition, wherein in a case where the detection unit detects that malfunction occurs, the first holding unit releases the first switching element from the turn-off condition at a timing when the control unit turns on the second switching element by the second control signal.

A further aspect of the present invention relates to an image forming apparatus including an image forming unit configured to form an image on a recording material; and a power supply apparatus to supply power to the image forming apparatus, the power supply apparatus including a transformer including a primary winding and a secondary winding; a first switching element connected in series to the primary winding of the transformer; a second switching element connected in parallel to the primary winding of the transformer; a capacitor connected in series to the second switching element and connected in parallel along with the second switching element to the primary winding of the transformer; a feedback unit configured to output information according to voltage induced in the secondary winding of the transformer; a control unit configured to control turn-on or turn-off of the first switching element by a first control signal and control turn-on or turn-off of the second switching element by a second control signal based on the information output from the feedback unit, the control unit configured to perform a switching operation of alternate turn-on and turn-off of the first switching element and the second switching element before and after a dead time in which the first switching element and the second switching element are both turned off, a detection unit configured to detect that the power supply apparatus malfunctions; and a first holding unit configured to turn off the first switching element and holds the first switching element at a turn-off condition, wherein in a case where the detection unit detects that malfunction occurs, the first holding unit releases the first switching element from the turn-off condition at a timing when the control unit turns on the second switching element by the second control signal.

Further features of the present invention will become apparent from the following description of exemplary embodiments with reference to the attached drawings.

BRIEF DESCRIPTION OF THE DRAWINGS

FIGS. 1A, 1B and 1C are schematic views of a power circuit according to a first embodiment.

FIGS. 6A, 6B and 6C are schematic views of a power circuit according to a second embodiment.

FIG. 8 describes a control method in the second embodiment.

DESCRIPTION OF THE EMBODIMENTS

Figure 2A:
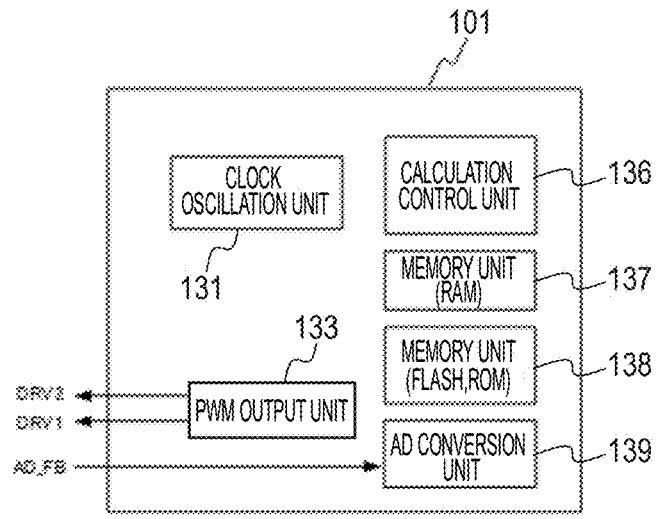
FIGS. 2A, 2B and 2C are schematic views illustrating the configuration of control units in the first embodiment.

Preferred embodiments of the present invention will now be described in detail in accordance with the accompanying drawings.

[Configuration of Power Supply Apparatus]

FIGS. 1A, 1B and 1C are each a circuit diagram illustrating an overview of a switching power circuit using an active clamp method in a first embodiment. An AC power supply 10, such as a commercial power supply, outputs AC voltage, and the voltage rectified by a bridge diode BD1, which is a full wave rectifying unit, is input to a switching power circuit 100. A smoothening capacitor C3 is used as a smoothening unit that smoothens the rectified voltage. The lower potential of the smoothening capacitor C3 is called potential DCL, and the higher potential of the smoothening capacitor C3 is called potential DCH. The switching power circuit 100 outputs power supply voltage V11 (also called output voltage V11) from input voltage Vin charged in the smoothening capacitor C3 to an insulated secondary side. In the present embodiment, the switching power circuit 100 outputs, for example, fixed voltage of 5 V as an example of the power supply voltage V11.

The switching power circuit 100 includes an insulated transformer T1 including a primary winding P1 and an auxiliary winding P2 on the primary side and a secondary winding S1 on the secondary side. Switching operation described with reference to FIG. 4A, which will be described later, supplies the secondary winding S1 with energy from the primary winding P1 of the transformer T1. The auxiliary winding P2 of the transformer T1 is used to rectify and smoothen forward voltage of the input voltage Vin applied to the primary winding P1 with the aid of a diode D4 and a capacitor C4 and supply power supply voltage V1.

A field effect transistor (hereinafter referred to as FET) FET1, which is a first switching element, is connected in series to the primary winding P1 of the transformer T1 on the primary side of the switching power circuit 100. A capacitor C2 for voltage clamping and an FET2, which is a second switching element, are connected in series to each other. The capacitor C2 for voltage clamping and the FET2, which are connected in series to each other, are connected to the primary winding P1 of the transformer T1 in parallel thereto. On the primary side of the switching power circuit 100, a control unit 101 and an FET driving unit 102 are provided as a unit for controlling the FET1 and the FET2. A capacitor C1 for voltage resonance, which is connected to the FET1 in parallel thereto, is provided to reduce loss produced when the FET1 and the FET2 are switched off. Instead, no capacitor C1 for voltage resonance may be provided, but the capacitance between the drain terminal and the source terminal of the FET1 may be used. To readily turn on the switching elements at zero volt, which will be described later, the capacitor C1 for voltage resonance is so selected to have capacitance smaller than that of the capacitor C2 for voltage clamping. A diode D1 in the present embodiment is the body diode of the FET1. Similarly, a diode D2 is the body diode of the FET2.

A diode D11 and a capacitor C11, which are each a secondary-side rectifying/smoothening unit that rectifies and smoothens flyback voltage produced in the secondary winding S1 of the transformer T1, are provided on the secondary side of the switching power circuit 100. The voltage induced in the secondary winding S1 of the transformer T1 is rectified and smoothened by the diode D11 and the capacitor C11, and the rectified, smoothened voltage is output as the power supply voltage V11. As a feedback unit that feeds back information according to the power supply voltage V11 output to the secondary side to the primary side, a feedback unit 115 is provided on the secondary side of the switching power circuit 100 (dotted-line frame portion in FIG. 1A). The control unit 101 in the present embodiment is a calculation control element, such as a CPU or an ASIC that operates based on a clock signal produced, for example, by an oscillator. The control unit 101 will be described in detail with reference to FIGS. 2A, 2B and 2C. The thus adapted control unit 101 can perform complicated waveform control of a control signal DRV1 (first control signal) and control signal DRV2 (second control signal) in the form of a simple, inexpensive circuit configuration.

Power supply voltage V2 produced by a DC/DC converter 104 is output via an OUT terminal of the DC/DC converter 104 and supplied between a VC terminal and a G terminal of the control unit 101. The control unit 101 outputs the control signals DRV1 and DRV2 based on a voltage signal input from the feedback unit 115 to an FB terminal of the control unit 101 and controls the FET1 and the FET2 via the FET driving unit 102. The control signal DRV1 is a signal for driving the FET1, and the control signal DRV2 is a signal for driving the FET2.

The FET driving unit 102 is a circuit that produces a gate drive signal DL of the FET1 according to the control signal DRV1 input from the control unit 101 and produces a gate drive signal DH of the FET2 according to the control signal DRV2 input from the control unit 101. The power supply voltage V1, which is produced by the auxiliary winding P2, is supplied between a VC terminal and a G terminal of the FET driving unit 102. To drive the FET2, a charge pump circuit, which includes a capacitor C5 and a diode D5, supplies the power supply voltage V1 between a VH terminal and a GH terminal of the FET driving unit 102. The FET driving unit 102, when the control signal DRV1 having a high level is input thereto, sets the gate drive signal DL of the FET1 at the high level, so that the FET1 is turned on. Similarly, the FET driving unit 102, when the control signal DRV2 having the high level is input thereto, sets the gate drive signal DH of the FET2 at the high level, so that the FET2 is turned on.

The DC/DC converter 104 is a three-terminal regulator or a step-down switching power circuit, converts the power supply voltage V1 input between a VC terminal and a G terminal into the power supply voltage V2, and outputs the power supply voltage V2 via the OUT terminal. A start-up circuit 103 is a three-terminal regulator or a step-down switching power supply, converts the input voltage Vin input between a VC terminal and a G terminal into the power supply voltage V1, and outputs the power supply voltage V1 via an OUT terminal. The start-up circuit 103 is a circuit that operates only when the power supply voltage V1 supplied from the auxiliary winding P2 is lower than or equal to a predetermined voltage value and is used to supply the power supply voltage V1 when the switching power circuit 100 starts.

[Feedback Unit]

The feedback unit 115 is used to keep the power supply voltage V11 at predetermined fixed voltage. The voltage value of the power supply voltage V11 is set by reference voltage at a reference terminal REF of a shunt regulator IC5, a resistor R52 and a resistor R53. When the power supply voltage V11 is higher than the predetermined voltage (5 V in the description), current flows via a cathode terminal K of the shunt regulator IC5, so that the secondary-side diode of a photocoupler PC5 conducts the current via a pullup resistor R51. As a result, the primary-side phototransistor of the photocoupler PC5 operates, so that the charge in a capacitor C6 is discharged. The voltage at the FB terminal of the control unit 101 (hereinafter referred to as FB-terminal voltage) therefore decreases. On the other hand, when the power supply voltage V11 decreases to a value lower than 5 V, the secondary-side diode conducts no current. As a result, the primary-side phototransistor of the photocoupler PC5 is turned off, and current to charge the capacitor C6 is supplied from the power supply voltage V2 via a resistor R2. The FB-terminal voltage of the control unit 101 therefore increases. The feedback unit 115 thus changes the FB-terminal voltage of the control unit 101 according to a change in the power supply voltage V11.

The control unit 101 detects the FB-terminal voltage input from the feedback unit 115 to perform feedback control for keeping the power supply voltage V11 at the predetermined fixed voltage. The control unit 101 can thus indirectly perform the feedback control of the power supply voltage V11 by monitoring the FB-terminal voltage.

[Configuration of Control Unit 101]

FIG. 2A is a block diagram illustrating the internal configuration of the control unit 101. The control unit 101 is a single-chip microcomputer including the following components therein: a clock oscillation unit 131, which is a generation unit; a PWM output unit 133; a calculation control unit 136; a memory unit 137; a memory unit 138; and an AD conversion unit 139. The memory unit 137 is a RAM, and the memory unit 138 includes one of a ROM and a flash memory (FLASH). The calculation control unit 136 is a control unit that operates based on a clock signal produced by the clock oscillation unit 131, reads instructions and data stored in the memory unit 138 into the memory unit 137, and then successively performs calculation. The calculation control unit 136 controls set values of the two control signals DRV1 and DRV2 from the PWM output unit 133 (control start timing, cycle and duty) based on an AD_FB signal detected by the AD conversion unit 139 and input via the FB terminal. The FET1 and the FET2 are thus turned on and off.

An example of a malfunctional status of the control unit 101 described above includes a case where the clock oscillation unit 131 stops operating due, for example, to externally incoming noise so that the clock signal stops and the calculation control unit 136, as a result of no clock signal, stops (cannot continue) performing processing in some cases. The clock oscillation unit 131 of the control unit 101 in FIG. 2A has the function of automatically resuming outputting the clock signal after the clock signal is not output due, for example, to noise and a period then elapses. Therefore, after the state in which the clock signal is not output and the calculation control unit 136 stops (cannot continue) performing processing lasts for the predetermined period, the clock oscillation unit 131 oscillates again to output the clock signal, whereby the calculation control unit 136 can resume suspended processing.

Figure 2B:
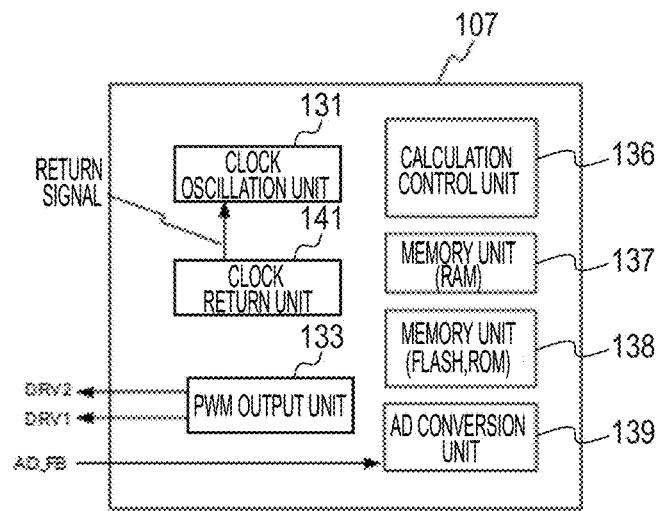
Figure 2C:
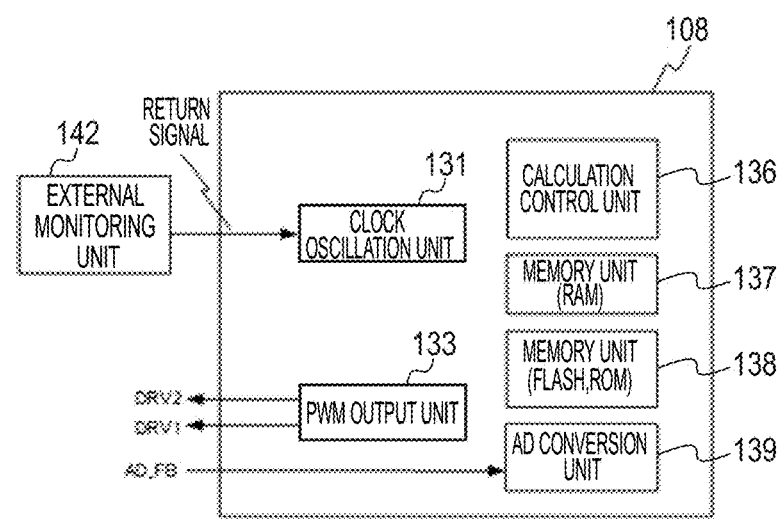

FIG. 2B is a block diagram illustrating the internal configuration of a control unit 107 including a clock return unit 141, which is a detection unit that is incorporated in the control unit 107, monitors the clock signal output from the clock oscillation unit 131, and outputs a return signal when detecting that the clock signal is not output. The clock oscillation unit 131, when the return signal is input thereto, oscillates again to output the clock signal. FIG. 2C is a block diagram illustrating the internal configuration of a control unit 108 including an external monitoring unit 142, which is a detection unit that is disposed external to the control unit 108, monitors the clock signal output from the clock oscillation unit 131, and outputs a return signal when detecting that the clock signal is not output. The clock oscillation unit 131, when the return signal is input thereto, oscillates again to output the clock signal. As described above, the control unit 107 illustrated in FIG. 2B or the control unit 108 illustrated in FIG. 2C may be employed in place of the control unit 101.

[Current Detection Unit]

A current detection unit 120 surrounded with the chain line will be described with reference to FIG. 1A. The current detection unit 120 includes an overcurrent detection circuit that detects instantaneous current (hereinafter referred to as OCP circuit) and an overcurrent detection circuit that detects average current (hereinafter referred to as OLP circuit). The OCP circuit, which is a first current detection unit, includes a comparator IC1 and voltage dividing resistors R22 and R23, and the output terminal of the comparator IC1 is connected to a latch unit 105, which is a first holding unit. On the other hand, the OLP circuit, which is a second current detection unit, includes an average current detection unit 119, which detects an average current value, a comparator IC2, and voltage dividing resistors R24 and R25, and the output terminal of the comparator IC2 is connected to a latch unit 106, which is a second holding unit.

Figure 3:
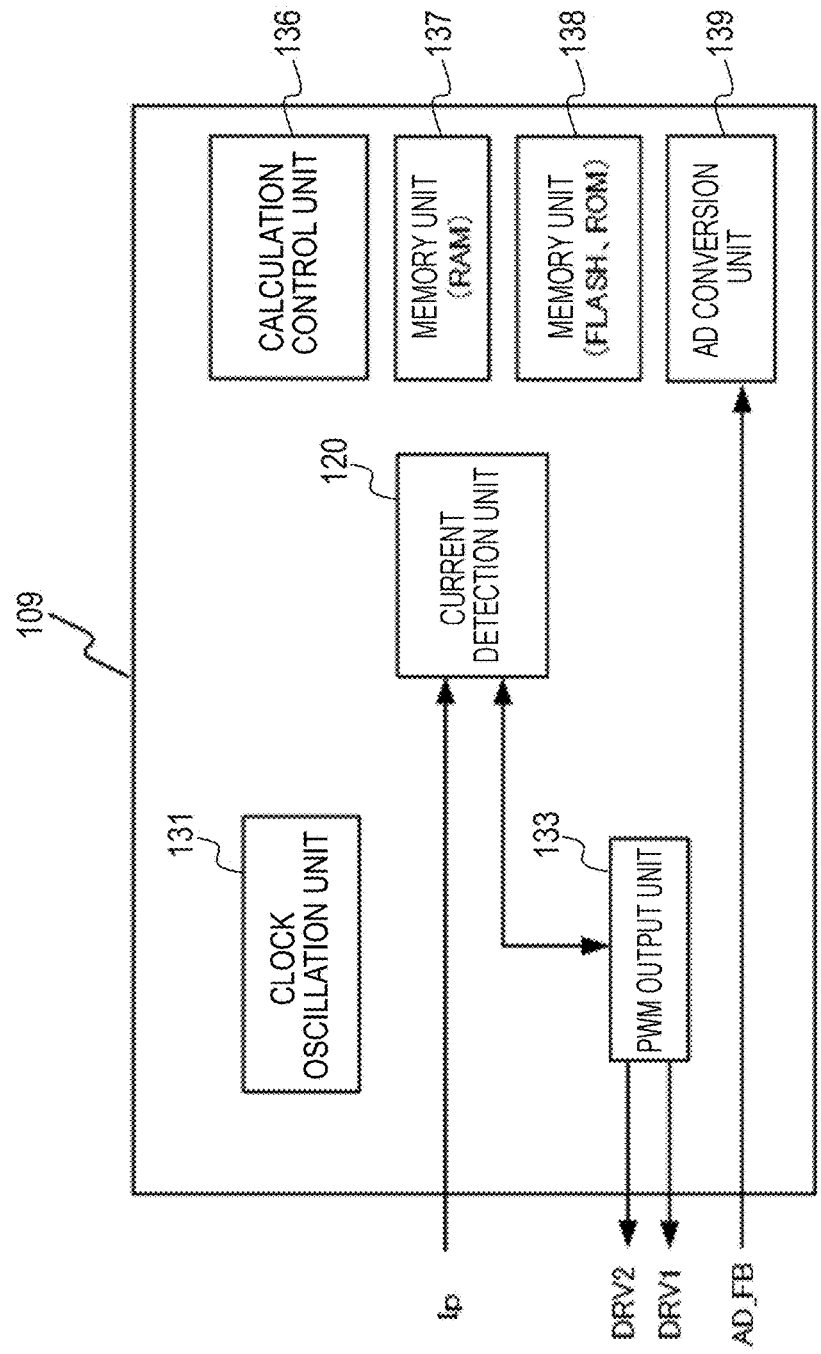
FIG. 3 is a schematic view illustrating the configuration of a control unit in the first embodiment.

FIG. 1B is a circuit diagram illustrating the internal configuration of the latch unit 105. The latch unit 105 includes a PNP-type transistor Tr1, NPN-type transistors Tr2 and Tr3 (hereinafter simply referred to as transistors Tr1, Tr2 and Tr3), a capacitor Cr1, a diode D23, resistors and other components. FIG. 1C is a circuit diagram illustrating the internal configuration of the latch unit 106, and the latch unit 106 includes a PNP-type transistor Tr4, an NPN-type transistor Tr5 (hereinafter simply referred to as transistors Tr4 and Tr5), a capacitor Cr2, a diode D24, resistors and other components. The circuit configuration of each of the OCP circuit and the OLP circuit illustrated in FIG. 1A, the latch units 105 illustrated in FIG. 1B, and the latch unit 106 illustrated in FIG. 1C is presented by way of example. The present invention is not limited to the circuit configurations described above and may use other elements. Further, for example, a control unit 109 illustrated in FIG. 3, which incorporates the current detection unit 120 illustrated in FIG. 1A, may be employed in place of the control unit 101 illustrated in FIG. 2A. The current detection unit 120 may be adapted to stop outputting the control signals DRV1 and DRV2 output from the PWM output unit 133 based on current Ip flowing through a current detection resistor R21.

[Method for Controlling Switching Power Circuit]

Figure 4A:
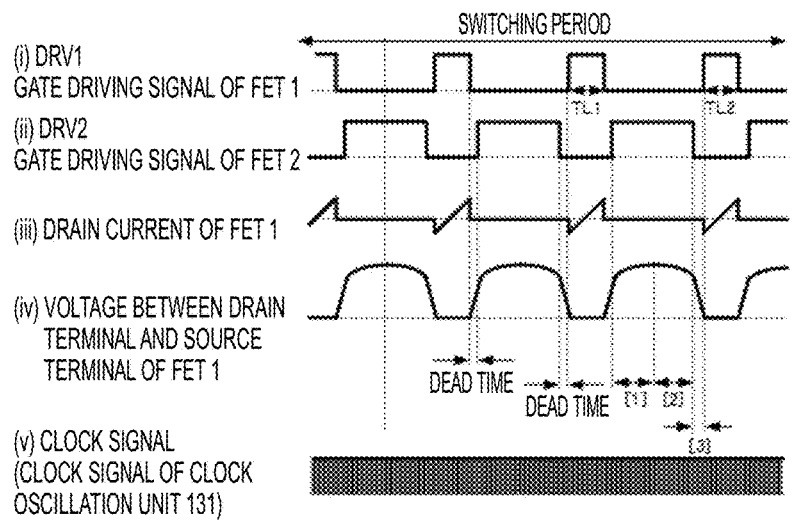
FIGS. 4A and 4B describe a control method in the first embodiment.
Figure 4B:
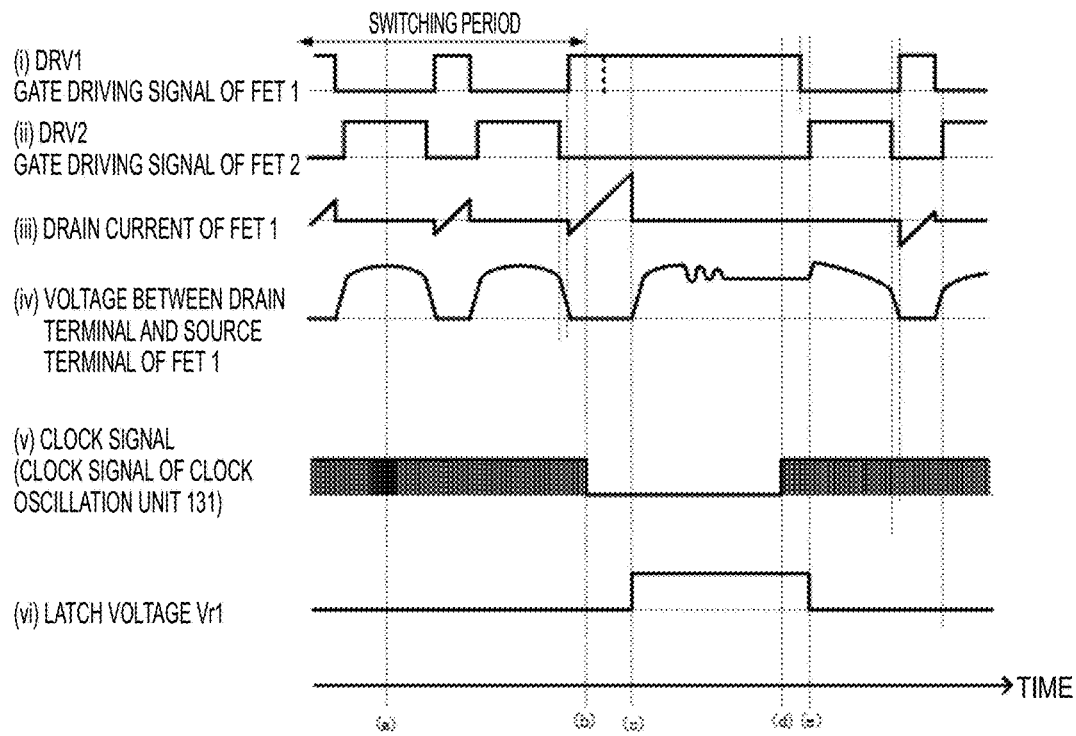
Figure 5:
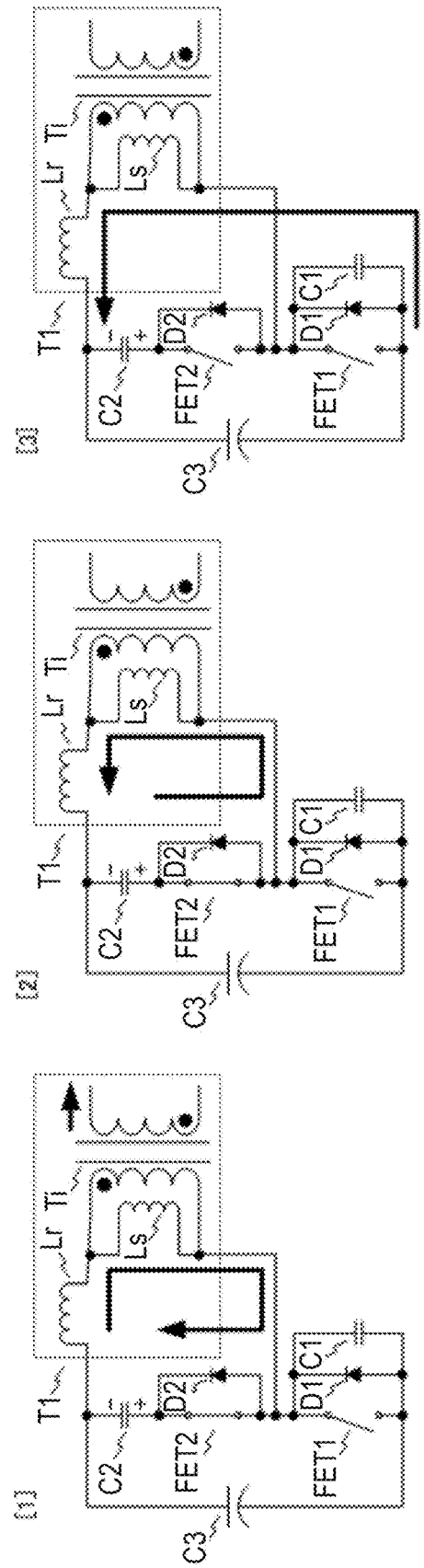
FIG. 5 is a simplified circuit diagram for describing the control method in the first embodiment.

FIGS. 4A and 4B describe a method for controlling the switching power circuit 100 using the active clamping method performed by the control unit 101. In FIGS. 4A and 4B, (i) illustrates the waveform of the control signal DRV1 corresponding to the gate drive signal DL of the FET1, and (ii) illustrates the waveform of the control signal DRV2 corresponding to the gate drive signal DH of the FET2. Further, in FIGS. 4A and 4B, (iii) illustrates the waveform of the drain current of the FET1, (iv) illustrates the waveform of the voltage between the drain terminal and the source terminal of the FET1, and (v) illustrates the waveform of the clock signal of the clock oscillation unit 131. (vi)

of FIG. 4B illustrates the waveform of latch voltage Vr1, which is the charge potential of the capacitor Cr1 of the latch unit 105 described later. The horizontal axes of (i) to (vi) each represent time. FIG. 5 illustrates the current path in a plurality of periods ([1] to [3]) illustrated in FIGS. 4A and 4B along with a simplified circuit diagram. The operation of the switching power circuit 100 in each of the periods will be described below. In FIG. 5, the transformer T1 is divided into leakage inductance Lr, coupled inductance Ls and an ideal transformer T1. Further, in the circuit illustrated in FIG. 5, the current flowing in each of the periods [1] to [3] is drawn with a thick solid-line arrow.

[Switching Period]

A normal switching operation will first be described with reference to FIG. 4A. The clock signal is continuously output when the clock oscillation unit 131 in the control unit 101 normally operates, as illustrated in (v) of FIG. 4A. The switching period is a period for which the FET1 and the FET2 are so repeatedly controlled as to be alternately turned on and off in such a way that dead time during which the FET1 and the FET2 are both turned off is interposed between the FET1-turn-on/off timings and FET2-turn-on/off timings. Operation using the FET2 and the capacitor C2 for voltage clamping in the switching period (hereinafter referred to as active clamp operation) will be described with reference to FIG. 4A and [1] to [3] of FIG. 5.

During the turn-on condition of the FET1, current flows through the leakage inductance Lr and the coupled inductance Ls of the transformer T1 (see (iii) of FIG. 4A). The period [1] illustrated in FIG. 5 is a period in which the FET1 operates in the turn-on condition for a period TL1 and then turned off and the FET2 is turned on after the dead time. The current flowing during the turn-on condition of the FET1 allows the transformer T1 to charge the positive terminal of the capacitor C2 for voltage clamping via one of the FET2 and the diode D2. Since kickback voltage provided by the leakage inductance Lr can be absorbed by the capacitor C2 for voltage clamping, surge voltage applied between the drain terminal and the source terminal of the FET1 can be suppressed. When the voltage of the capacitor C2 for voltage clamping increases, the diode D11 is turned on, and power is supplied to the secondary side of the switching power circuit 100 via the secondary winding S1 of the transformer T1.

In the period [2] illustrated in FIG. 5, the capacitor C2 for voltage clamping resonates with the leakage inductance Lr and the coupled inductance Ls of the transformer T1, so that current flows from the positive terminal of the capacitor C2 to the transformer T1 via the FET2. When the voltage of the capacitor C2 for voltage clamping decreases, the secondary-side diode D11 does not conduct current, so that no power is supplied to the secondary side of the switching power circuit 100. Further, holding the conduction state of the FET2 allows an increase in current flowing from the capacitor C2 for voltage clamping to the leakage inductance Lr and the coupled inductance Ls of the transformer T1.

The period [3] illustrated in FIG. 5 is the dead time period, in which the FET1 and the FET2 are both in the turn-off condition. In the period [3] illustrated in FIG. 5, turn-off the FET2 causes the capacitance of the capacitor connected to the primary winding P1 of the transformer T1 to decrease from the value of the combined capacitance of the capacitor C2 for voltage clamping and the capacitor C1 for voltage resonance to the capacitance of the capacitor C1 for voltage resonance. The current flowing through the leakage inductance Lr and the coupled inductance Ls of the transformer T1 therefore allows the charge accumulated in the capacitor C1 for voltage resonance to be regenerated in the capacitor C3 for smoothening. After the regeneration operation described above is completed, the diode D1 conducts current. After the period [3] illustrated in FIG. 5 ends, and when the FET1 is turned on with the diode D1 conducting current, the FET1 can perform the switching operation in which the turn-off condition transitions to the turn-on condition in the zero-volt condition. The switching operation from the turn-off condition of the FET1 to the turn-on condition in the zero-volt condition is hereinafter referred to as zero-volt switching. As described above, the operation from the point of time when the FET2 is turned on to the point of time when the regeneration in the capacitor C3 for smoothening is completed is referred to as active clamp operation. The FET1 operates in the turn-on condition during the following period TL2.

As described above, the action of the capacitor C2 for voltage clamping and the FET2 in the active clamp operation described with reference to FIG. 4A and [1] to [3] in FIG. 5 allows suppression of surge voltage in the FET1. Further, the charge in the capacitor C1 for voltage resonance can be regenerated in the capacitor C3 for smoothening, and the zero-volt switching of the FET1 can be also performed. Using the active clamp method therefore allows improvement in the efficiency of the switching power circuit 100 in the switching period illustrated in FIG. 4A.

[Operation of OLP Circuit]

The operation of the OLP circuit will next be described with reference to FIG. 1A. The current flowing into the FET1 is detected as average current-voltage Iav by the current detecting resistor R21 and the average current detection unit 119 and input to the negative terminal of the comparator IC2. The comparator IC2 compares reference voltage Iavo, which is set by the power supply voltage V2 and the voltage dividing resistors R24 and R25 and input to the positive terminal of the comparator IC2, with the average current-voltage Iav, which is the result of the detection performed by the average current detection unit 119. When the average current-voltage Iav is greater than the reference voltage Iavo, the comparator IC2 outputs an IavOff signal having the low level to the latch unit 106. The reference voltage Iavo is so set at a value greater than the average current-voltage Iav in the normal operation as not to cause the OLP circuit to operate in the normal operation. The output terminal of the comparator IC2 therefore has high impedance (open collector) in the normal operation.

The operation of the latch unit 106 will next be described. The power supply voltage V2, the potential DCL, and the IavOff signal are input to the latch unit 106, and the latch unit 106 outputs a DRVOff signal, as illustrated in FIGS. 1A and 1C. In the normal operation, since the output terminal of the comparator IC2 has high impedance, the base terminal voltage of the transistor Tr4 has the same potential as that of an emitter terminal thereof, so that the transistor Tr4 is turned off. As a result, the base-emitter voltage of the transistor Tr5 is lower than threshold voltage that turns on the transistor Tr5, so that the transistor Tr5 is turned off, and a collector terminal of the transistor Tr5 has high impedance. The DRVOff signal therefore has high impedance.

In malfunctional operation, such as a load short circuit, the value of the average current-voltage Iav is higher than the reference voltage Iavo, so that the low-level IavOff signal is output from the output terminal of the comparator IC2. The base terminal voltage of the transistor Tr4 therefore goes to the low level, so that the transistor Tr4 is turned on. When the transistor Tr4 is turned on, the power supply voltage V2 is applied to the capacitor Cr2 and the base terminal of the transistor Tr5 via the transistor Tr4. The power supply voltage V2 charges the capacitor Cr2, so that latch voltage Vr2, which is charge potential of the capacitor Cr2, keeps the base-emitter voltage of the transistor Tr5 higher than the threshold voltage, whereby the transistor Tr5 operates in the turn-on condition. As a result, the collector terminal of the transistor Tr5 goes to the low level, and the DRVOff signal goes to the low level.

The base terminal voltage of the transistor Tr4 is higher than the collector terminal voltage of the transistor Tr5 by forward voltage Vf of the diode D24, and the base-emitter voltage of the transistor Tr4 is therefore high enough to turn on the transistor Tr4. Since the potential accumulated in the capacitor Cr2 allows the base-emitter voltage of the transistor Tr5 to be higher than the threshold voltage, the transistor Tr5 is held turned on, and the DRVOff signal is held at the low level. The control signal DRV1 therefore goes to the low level via a diode D22 irrespective of whether the control signal DRV1 output from the control unit 101 has one of the high level and the low level. As a result, the gate drive signal DL of the FET1 output from the FET driving unit 102 forcibly goes to the low level. Similarly, the control signal DRV2 goes to the low level via a diode D20 irrespective of whether the control signal DRV2 output from the control unit 101 has one of the high level and the low level. As a result, the gate drive signal DH of the FET2 output from the FET driving unit 102 forcibly goes to the low level. Detecting the average current and causing the switching power supply to stop operating as described above allows the switching power supply to safely stop operating even when a layer short circuit occurs at the output terminal or a non-rated load is connected.

[Operation of OCP Circuit]

The operation of the OCP circuit will next be described with reference to FIG. 1A. The current flowing into the FET1 is current-to-voltage converted by the current detection resistor R21 into detected voltage Ip, which is input to the negative terminal of the comparator IC1. The comparator IC1 compares reference voltage Ipo, which is produced by causing the voltage dividing resistors R22 and R23 to divide the power supply voltage V2 and input to the positive terminal of the comparator IC1, with the detected voltage Ip, and when the detected voltage Ip is higher than the reference voltage Ipo, the comparator IC1 outputs an IpOff signal having the low level to the latch unit 105. The reference voltage Ipo is so set at a value greater than the detected voltage Ip in the normal operation as not to cause the OCP circuit to operate in the normal operation. The output terminal of the comparator IC1 therefore has high impedance in the normal operation.

The operation of the latch unit 105 will next be described. The power supply voltage V2, the potential DCL, the IpOff signal, and the control signal DRV2 are input to the latch unit 105, and the latch unit 105 outputs a DRV1Off signal, as illustrated in FIGS. 1A and 1B. In the normal operation, since the output terminal of the comparator IC1 has high impedance, the base terminal voltage of the transistor Tr1 has the same potential as that of the emitter terminal thereof, so that the transistor Tr1 is turned off. As a result, the base-emitter voltage of the transistor Tr2 is lower than threshold voltage, so that the transistor Tr2 is turned off, and the collector terminal of the transistor Tr2 has high impedance. The DRV1Off signal therefore has high impedance.

[Operation of Malfunctional Control Unit 101]

Operation of protecting the switching power circuit 100 when the control unit 101 malfunctions, which is characteristic operation of the present embodiment, will next be described in detail. When noise or any other undesirable signal is externally input to the switching power circuit 100, the control unit 101 malfunctions and the PWM output unit 133 therefore temporarily stops outputting a PWM signal in some cases. As an example of the case where the PWM output unit 133 stops outputting the PWM signal, a description will be made of a malfunctional status of the control unit 101 in which the clock oscillation unit 131 stops outputting the clock signal by way of example. FIG. 4B illustrates detailed operation in the case where the clock oscillation unit 131 stops outputting the clock signal. When the clock signal stops, the control signals DRV1 and DRV2, which are PWM signals output from the PWM output unit 133, cannot be controlled, so that the states of the control signals DRV1 and DRV2 at the point of time when the clock signal stops are held. (a) to (e) in FIG. 4B represent timing (point of time). In the following description, the circuit operation at each of the timings will be described with reference to FIG. 4B.

(Timing a) Switching Operation

The timing (a) is the point of time when the control signal DRV2 having the high level and the control signal DRV1 having the low level are output from the control unit 101 ((i), (ii) of FIG. 4B). At this point, the FET1 operates in the turn-off condition, and the FET2 operates in the turn-on condition, so that the FET1 and the FET2 perform the switching operation.

(Timing b) Clock Signal Stops

The timing (b) is the point of time when the clock oscillation unit 131 of the control unit 101 stops outputting the clock signal due, for example, to disturbance noise ((v) of FIG. 4B). When the clock signal stops, the calculation control unit 136 of the control unit 101 also stops operating. As a result, the states of the control signals DRV1 and DRV2 output from the PWM output unit 133 when the clock signal stops are held, that is, the control signal DRV1 is held at the high level, and the control signal DRV2 is held at the low level. Therefore, when the control signal DRV1 has the high level and the PWM signals output from the PWM output unit 133 are held, the period for which the control signal DRV1 has the high level is prolonged ((i) of FIG. 4B), and the FET1 keeps having the turn-on condition during the prolonged period. As a result, the drain current of the FET1 keeps flowing ((iii) of FIG. 4B). The drain current of the FET1 is current-to-voltage converted by the current detection resistor R21 and detected as the detected voltage Ip, as illustrated in FIG. 1A. In the signal waveform of the control signal DRV1 in (i) of FIG. 4B, the broken line between the timing (b) and the timing (c) represents the timing when the control signal DRV1 falls from the high level to the low level if the clock signal has not stopped.

(Timing c) Operation of OCP Circuit

The timing (c) is the point of time when the OCP circuit described above operates. The operation of the OCP circuit and the latch unit 105 will be described with reference to FIGS. 1A and 1B. When the drain current of the FET1 keeps flowing so that the detected voltage Ip becomes greater than the reference voltage Ipo, the IpOff signal having the low level is output from the output terminal of the comparator IC1. As a result, the base terminal voltage of the transistor Tr1 of the latch unit 105 goes to the low level, so that the transistor Tr1 is turned on. When the transistor Tr1 is turned on, the power supply voltage V2 is applied to the capacitor Cr1 and the base terminal of the transistor Tr2 via the transistor Tr1. The potential accumulated in the capacitor Cr1 causes the base-emitter voltage of the transistor Tr2 to be higher than the threshold voltage, so that the transistor Tr2 is turned on. As a result, the collector terminal of the transistor Tr2 goes to the low level, and the DRV1Off signal goes to the low level. The base terminal voltage of the transistor Tr1 is higher than the collector terminal voltage of the transistor Tr2 by forward voltage Vf of the diode D23, and the base-emitter voltage of the transistor Tr1 is therefore high enough to turn on the transistor Tr1. Since the latch potential Vr1, which is the potential accumulated in the capacitor Cr1, holds the base-emitter voltage of the transistor Tr2 at a value higher than the threshold voltage, the transistor Tr2 is held in the turn-on condition, and the DRV1Off signal is also held at the low level.

Since the DRV1Off signal has the low level, the control signal DRV1 input to the FET driving unit 102 goes to the low level via the diode D21 irrespective of whether the control signal DRV1 output from the control unit 101 has one of the high level and the low level. As a result, the gate drive signal DL of the FET1, which is output from the FET driving unit 102, forcibly goes to the low level. The FET1 is therefore turned off, so that no drain current flows ((iii) of FIG. 4B). This timing is the timing (c) illustrated in FIG. 4B.

As described above, after the control signal DRV1 is held at the low level by the OCP circuit and the latch unit 105, the FET1 has the turn-off condition, so that no drain current of the FET1 flows. The detected voltage Ip detected by the current detecting resistor R21 therefore decreases, and when the detected voltage Ip decreases to voltage lower than the reference voltage Ipo, the value of the IpOff signal output from the output terminal of the comparator IC1 changes from the low level to high impedance. Since the OCP circuit thus causes the FET1 to be turned off as described above even if the clock signal stops due, for example, to noise, the switching operation of the FET1 can be terminated without breakage of the FET1 due to overcurrent.

(Timing d) Clock Signal Resumes Oscillation

The timing (d) is the point of time when no disturbance noise or any other undesirable signal is present and the clock oscillation unit 131 automatically resumes oscillating to output the clock signal. The clock oscillation unit 131 may resume oscillating automatically as illustrated in FIG. 2A or in response to the return signal illustrated in FIGS. 2B and 2C, as described above. Since the control unit 101 resumes operating from the state in which the clock signal has stopped (timing (b)), the control signal DRV1 is held at the high level. The FET1 is, however, still held in the turn-off condition even when the operation of the control unit 101 is resumed by the operation of the latch unit 105 of the OCP circuit described above (latch voltage Vr1 illustrated in (vi) of FIG. 4B). This avoids a situation in which the FET1 is turned on when the clock signal resumes oscillating (timing (d)) and performs hard switching. Since the control unit 101 resumes operating from the state at the point of time when the clock signal has stopped (timing (b)), the control signal DRV1 goes to the low level when a predetermined period elapses after the clock signal resumes oscillating. That is, if the clock signal has not stopped at the timing (b), the control signal DRV1 goes to the low level after the elapse of the period until the timing when the control signal DRV1 falls to the low level (broken line in (i) of FIG. 4B).

(Timing e) Release of Latch Unit

The timing (e) is the point of time when the latch state of the latch unit 105 is released. The circuit operation performed when the latch state is released will be described with reference to FIGS. 1A, 1B and 4B. When the control signal DRV2 having the high level is output from the control unit 101 ((ii) of FIG. 4B) and input to the latch unit 105, the base-emitter voltage of the transistor Tr3 becomes higher than the threshold voltage, so that the transistor Tr3 is turned on. When the transistor Tr3 is turned on, the charge accumulated in the capacitor Cr1 is discharged via the transistor Tr3 ((vi) of FIG. 4B). As a result, the base-emitter voltage of the transistor Tr2 becomes lower than the threshold voltage, so that the transistor Tr2 is turned off. Further, the base terminal voltage of the transistor Tr1 becomes equal to the potential at the emitter terminal thereof, so that the transistor Tr1 is turned off. When the transistor Tr1 is turned off, no power supply voltage V2 is supplied to the capacitor Cr1, so that the base-emitter voltage of the transistor Tr2 remains lower than the threshold voltage. This releases the state in which the DRV1Off signal from the latch unit 105 holds the control signal DRV1 at the low level.

The circuit operation has been described with reference to the case where the OCP circuit holds the FET1 turned on to prevent breakage of the FET1 when the control signal DRV1 has the high level and the clock signal stops. No circuit operation will be described in a case where the control signal DRV1 has the low level because the FET1 is not turned on in this case irrespective of whether the control signal DRV2 has one of the high level and the low level. Further, in the present embodiment, the timing (d) when the control unit 101 resumes operating cannot be detected. To detect the timing (d) when the control unit 101 resumes operating, a circuit that detects that the control unit 101 has resumed operating needs to be provided, such as a determination unit 202 of a switching power circuit 200 illustrated in FIG. 6A, which will be described later.

In the switching power circuit 100 in the present embodiment, the state in which the DRV1Off signal output from the latch unit 105 holds the control signal DRV1 at the low level is released when the control signal DRV2 becomes the high level. The switching power circuit 100 in the present embodiment is therefore characterized in that no circuit that detects that the clock signal has resumed oscillating so that the control unit 101 has resumed operating needs to be provided and the switching operation can be resumed at an optimum timing. As a result, even when the control unit 101 malfunctions due, for example, to disturbance noise and the OCP circuit performs the overcurrent protection as described with reference to FIG. 4B, the output voltage V11 can be output, whereby the usability and the reliability of the switching power circuit 100 can both be provided.

Further, the present embodiment uses both the OCP circuit, which detects drain overcurrent of the FET1 whenever the switching is performed and causes the FET1 to stop performing the switching, and the OLP circuit, which detects average drain current and causes the FET1 and the FET2 to stop performing the switching. Therefore, the OCP circuit can prevent breakage of the FET1 due to overcurrent in a short period, and the OLP circuit can prevent thermal breakage of the FET1 and the FET2 due to overcurrent for a long period, whereby the safety and reliability of the switching power circuit 100 can be increased. The OCP circuit can also be used to perform protection in a case where a load to which the output voltage v11 is output experiences a short circuit, in addition to the protection in the case where the control unit 101 stops operating, as described with reference to FIG. 4B.

The first embodiment has been described with reference to the case where the clock signal malfunctions, but the present invention is not limited to the case. The first embodiment is also effective in a malfunction in which the PWM output unit 133 temporarily stops outputting the PWM signal due to a malfunction in the control unit 101 so that the turn-on period of the FET1 is prolonged as compared with the turn-on period in the normal operation as well as the malfunction in which the clock signal stops.

As described above, according to the present embodiment, the circuit can be protected from overcurrent also when the control unit stops operating, and the output of the power supply voltage to a load can be maintained.

The first embodiment has been described with reference to the circuit operation in which when the clock signal stops due, for example, to disturbance noise, the OCP circuit detects that overcurrent is flowing through the FET1 and causes the control signal DRV1 to go to the low level so that the FET1 is forcibly turned off. A second embodiment will be described with reference to circuit operation in which the FET1 is forcibly turned off when the control unit malfunctions based on a signal output from the control unit and representing the operation state.

[Configuration of Switching Power Supply Apparatus]

FIGS. 6A, 6B and 6C are each a circuit diagram illustrating an overview of a switching power circuit 200 using the active clamp method in the second embodiment. In FIG. 6A, unlike the circuit diagram of FIG. 1A in the first embodiment, the control unit 101 and the current detection unit 120 in FIG. 1A are omitted, and a control unit 201, a determination unit 202 and a latch unit 203 are added. The same components as those in FIG. 1A in the first embodiment have the same reference characters and will not be described.

[Configuration of Control Unit]

Figure 7A:
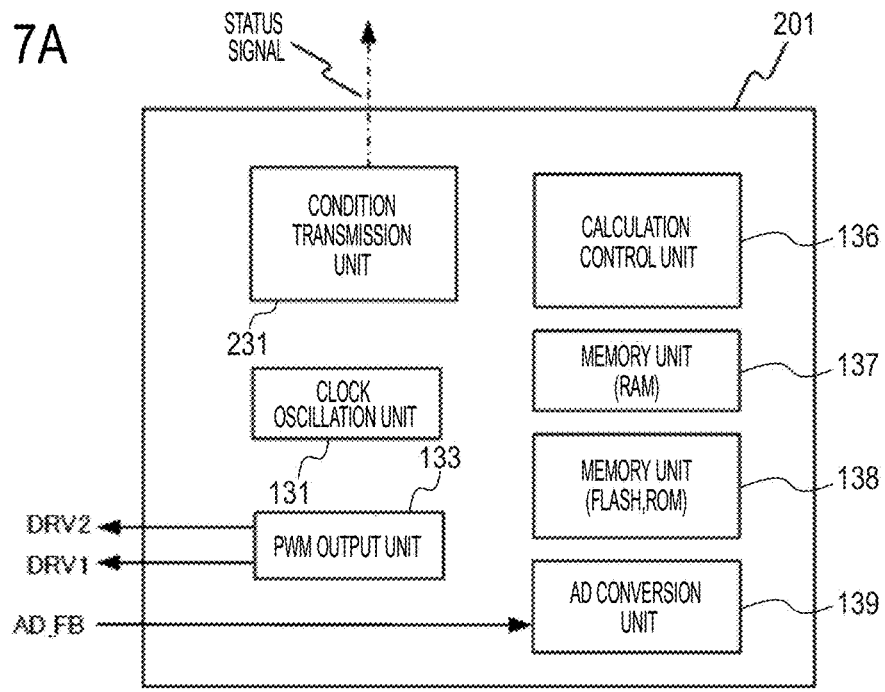
FIGS. 7A and 7B are schematic views illustrating the configuration of control units in the second embodiment.

FIG. 7A is a block diagram illustrating the internal configuration of the control unit 201 in the present embodiment. In the control unit 201, a condition transmission unit 231, which outputs a high-level or low-level STATUS signal (condition signal) according to the operation status of the control unit 201, is added to the configuration of the control unit 101 described in the first embodiment. The other components excluding the condition transmission unit 231 are the same as those of the control unit 101 in the first embodiment and will not therefore be described.

Figure 7B:
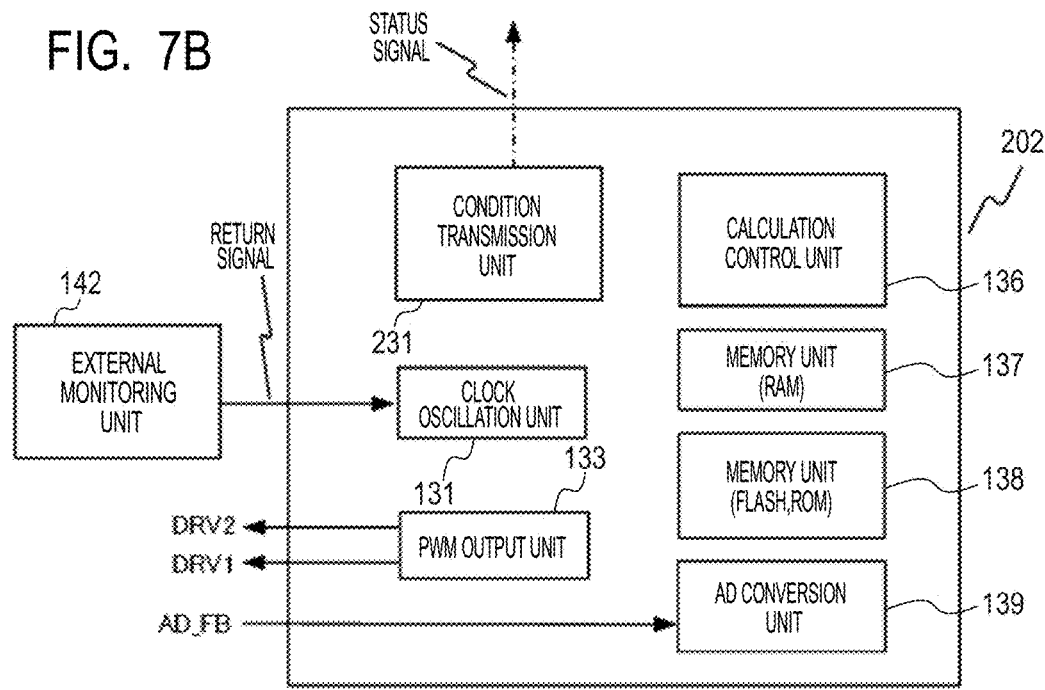

The condition transmission unit 231 monitors the clock signal output from the clock oscillation unit 131. When the clock oscillation unit 131 stops outputting the clock signal due, for example, to external noise (timing (b) in FIG. 8), the condition transmission unit 231 sets the STATUS signal at the low level, as illustrated in (v) and (v') of FIG. 8, which will be described later. Thereafter, when the clock oscillation unit 131 outputs the clock signal again (timing (c) in FIG. 8), the condition transmission unit 231 sets the STATUS signal at the high level ((v') of FIG. 8). The STATUS signal does not necessarily have the waveform illustrated in (v') of FIG. 8. Conversely, the STATUS signal may be set at the high level when the clock oscillation unit 131 stops outputting the clock signal, and the STATUS signal may be set at the low level when the clock oscillation unit 131 normally outputs the clock signal again. Still instead, when the clock oscillation unit 131 stops outputting the clock signal, the STATUS signal may not be output, and when the clock oscillation unit 131 normally outputs the clock signal again, the STATUS signal may be output. Further, the internal configuration of the control unit 201 may be set as illustrated in FIG. 7B, that is, the control unit 101 provided with the external monitoring unit 142, which monitors the clock signal and illustrated in FIG. 2C in the first embodiment, may be provided with the condition transmission unit 231.

[Configuration of Latch Unit]

The switching power circuit 200 includes the latch unit 203, which is a holding unit, as illustrated in FIG. 6A. FIG. 6B is a circuit diagram illustrating the internal configuration of the latch unit 203. The STATUS signal, a STATUSOff signal, the potential DCL are input to the latch unit 203, and the latch unit 203 outputs the DRVOff signal. Unlike the latch unit 105 illustrated in FIG. 1B in the first embodiment, the latch unit 203 uses the STATUS signal in place of the control signal DRV2, the STATUSOff signal in place of the IpOff signal, and the DRVOff signal in place of the DRV1Off signal. The circuit configuration of the latch unit 203 is the same as that of the latch unit 105 in the first embodiment, and the same circuit elements have the same reference characters and will not be described. Therefore, in the latch unit 203, when the STATUSOff signal goes to the low level, the transistors Tr1 and Tr2 are turned on, as in the latch unit 105 in the first embodiment. When the transistors Tr1 and Tr2 are turned on, the control signals DRV1 and DRV2 go to the low level via the diodes D21 and D25. The STATUSOff signal can thus control the DRVOff signal. When the STATUS signal changes from the low level to the high level, the transistor Tr3 is turned on, so that the charge accumulated in the capacitor Cr1 is discharged. The transistor Tr2 is therefore turned off, and the DRVOff signal has high impedance, so that the latch state is released.

[Configuration and Operation of Determination Unit]

The switching power circuit 200 includes the determination unit 202, which is a detection unit, as illustrated in FIG. 6A. The power supply voltage V2, the DCL potential, and the STATUS signal are input to the determination unit 202, and the determination unit 202 outputs the STATUSOff signal, as illustrated in FIG. 6C. The determination unit 202 controls the STATUSOff signal based on the STATUS signal output from the control unit 201, and the STATUSOff signal output from the determination unit 202 is input to the latch unit 203. As an example of the determination unit 202, FIG. 6C illustrates a circuit including a plurality of resistors and NPN-type transistors Tr21 and Tr22 (hereinafter simply referred to as transistors Tr21 and Tr22). It is, however, noted that the determination unit 202 does not necessarily have the circuit configuration illustrated in FIG. 6C and may, for example, have a configuration using an FET, an operational amplifier, a comparator and other ICs or a configuration in which the determination unit 202 is incorporated in the control unit 201.

The operation of the determination unit 202 will next be described with reference to FIGS. 6B and 6C. When the clock oscillation unit 131 outputs the clock signal, the STATUS signal output from the control unit 201 has the high level. The base-emitter voltage of the transistor Tr21 of the determination unit 202 is higher than the threshold voltage, so that the transistor Tr21 is turned on. The power supply voltage V2 is applied to the collector terminal of the transistor Tr21 and further to the base terminal of the transistor Tr22 via a resistor. When the transistor Tr21 operates in the turn-on condition, the base-emitter voltage of the transistor Tr22 is lower than the threshold voltage, so that the transistor Tr22 operates in the turn-off condition. Therefore, the collector terminal of the transistor Tr22 has high impedance, and the STATUSOff signal also has high impedance.

In the latch unit 203, when the STATUSOff signal input thereto has high impedance, the base terminal voltage of the transistor Tr1 has the same potential as the potential at the emitter terminal of the transistor Tr1, so that the transistor Tr1 operates in the turn-off condition. The base-emitter voltage of the transistor Tr2 is therefore lower than the threshold voltage, so that the transistor Tr2 operates in the turn-off condition. The DRVOff signal therefore has high impedance.

On the other hand, when the clock oscillation unit 131 stops outputting the clock signal, the STATUS signal output from the control unit 201 goes to the low level. The base-emitter voltage of the transistor Tr21 of the determination unit 202 is therefore lower than the threshold voltage, so that the transistor Tr21 operates in the turn-off condition. As a result, the power supply voltage V2 is applied to the base terminal of the transistor Tr22 via the resistor, so that the base-emitter voltage of the transistor Tr22 is higher than the threshold voltage, and the transistor Tr22 is turned on. The STATUSOff signal connected to the collector terminal of the transistor Tr22 therefore goes to the low level.

In the latch unit 203, when the STATUSOff signal goes to the low level, the transistor Tr1 is turned on, so that the base-emitter voltage of the transistor Tr2 is higher than the threshold voltage, and the transistor Tr2 is turned on. The DRVOff signal therefore goes to the low level. When the DRVOff signal goes to the low level, the control signal DRV1 output from the control unit 201 goes to the low level via the diode D21 irrespective of whether the control signal DRV1 has one of the high level and the low level. The gate drive signal DL of the FET1, which is output from the FET driving unit 102, therefore forcibly goes to the low level. Similarly, the control signal DRV2 also goes to the low level via the diode D25, and the gate drive signal DH of the FET2, which is output from the FET driving unit 102, therefore forcibly goes to the low level. As described above, the configuration in the second embodiment differs from the configuration in the first embodiment, in which the control unit 101 controls the FET1 according to the output from the OCP circuit, in that the determination unit 202 can control the FET1 according to the STATUS signal representing whether or not the clock signal from the control unit 201 is normal.

[Operation of Malfunctional Control Unit 201]

Operation of protecting the switching power circuit 200 when the control unit 201 malfunctions, which is characteristic operation of the present embodiment, will next be described in detail. Also in the present embodiment, as in the first embodiment, as an example of the case where the PWM output unit 133 of the control unit 201 stops outputting the PWM signal, a description will be made of a malfunctional status of the control unit 201 in which the clock oscillation unit 131 stops outputting the clock signal by way of example. FIG. 8 illustrates in detail the operation performed when the clock oscillation unit 131 stops outputting the clock signal. In FIG. 8, (i) illustrates the waveform of the control signal DRV1 corresponding to the gate drive signal DL of the FET1, and (ii) illustrates the waveform of the control signal DRV2 corresponding to the gate drive signal DH of the FET2. Further, in FIG. 8, (iii) illustrates the waveform of the drain current of the FET1, (iv) illustrates the waveform of the voltage between the drain terminal and the source terminal of the FET1, and (v) illustrates the waveform of the clock signal of the clock oscillation unit 131. Further, in FIG. 8, (v') illustrates the state of the STATUS signal, and (vi) illustrates the waveform of the latch voltage Vr1. The horizontal axes of (i) to (vi) each represent time.

In the switching power circuit 200 illustrated in FIG. 6A, when the clock signal stops, the control signals DRV1 and DRV2 output from the PWM output unit 133 cannot be controlled, as in the switching power circuit 100 illustrated in FIG. 1A in the first embodiment. As a result, the states of the control signals DRV1 and DRV2 at the point of time when the clock signal stops are held. (a) to (c) in FIG. 8 represent timing (point of time). In the following description, the circuit operation at each of the timings will be described with reference to FIG. 8.

(Timing a) Switching Operation

The timing (a) is the point of time when the control signal DRV2 having the high level is output from the control unit 201 and the control signal DRV1 is output at the low level ((i), (ii) of FIG. 8). At this point, the FET1 operates in the turn-off condition, and the FET2 operates in the turn-on condition, so that the FET1 and the FET2 perform the switching operation. During the period for which the clock signal in the control unit 201 normally operates, the STATUS signal has the high level, as illustrated in (v') of FIG. 8.

(Timing b) Clock Signal Stops

The timing (b) is the point of time when the clock oscillation unit 131 of the control unit 201 stops outputting the clock signal due, for example, to disturbance noise ((v) of FIG. 8). When the clock signal stops, the calculation control unit 136 of the control unit 201 also stops operating. As a result, the states of the control signals DRV1 and DRV2 output from the PWM output unit 133 when the clock signal stops are held, that is, the control signal DRV1 is held at the high level, and the control signal DRV2 is held at the low level. In the signal waveform of the control signal DRV1 in (i) of FIG. 8, the broken line between the timing (b) and the timing (c) represents the timing when the control signal DRV1 falls from the high level to the low level if the clock signal has not stopped.

When the clock signal stops, the STATUS signal goes to the low level ((v') of FIG. 8), as shown in the row of the STATUS signal. In FIG. 6C, since the STATUS signal goes to the low level, the base-emitter voltage of the transistor Tr21 in the determination unit 202 is lower than the threshold voltage, so that the transistor Tr21 operates in the turn-off condition. The power supply voltage V2 is therefore applied to the base terminal of the transistor Tr22 via the resistor, the base-emitter voltage of the transistor Tr22 is higher than the threshold voltage, so that the transistor Tr22 operates in the turn-on condition. As a result, the STATUSOff signal connected to the collector terminal of the transistor Tr22 goes to the low level.

In FIG. 6B, when the STATUSOff signal goes to the low level, the transistors Tr1 and Tr2 in the latch unit 203 are turned on, so that the DRVOff signal goes to the low level. The control signals DRV1 and DRV2 output from the control unit 201 therefore both go to the low level ((i) and (ii) of FIG. 8). As a result, the gate driving signal DL of the FET1 and the gate driving signal DH of the FET2, which are output from the FET driving unit 102, both forcibly go to the low level ((iii) of FIG. 8). As described above, even if the clock signal stops due, for example, to noise, the STATUS signal ((v') of FIG. 8) and the determination unit 202 can safely stop the switching operation with no breakage of the switching element FET1. Further, in (iii) of FIG. 8, the current waveform of the drain current drawn with the broken line represents the waveform of the drain current flowing through the FET1 ((iii) of FIG. 4B) until the OCP circuit detects overcurrent in the first embodiment. The present embodiment differs from the first embodiment in that the switching operation of the FET1 can be terminated before overcurrent flows through the FET1.

(Timing c) Clock Signal Resumes Oscillation

The timing (c) is the point of time when no disturbance noise or any other undesirable signal is present and the clock oscillation unit 131 automatically resumes oscillating to output the clock signal. When the control unit 201 normally operates, the STATUS signal goes to the high level ((v') of FIG. 8). The transistor Tr21 in the determination unit 202 is therefore turned on, and the transistor Tr22 is turned off, so that the value of the STATUSOff signal changes from the low level to high impedance. Further, in the latch unit 203, when the STATUS signal goes to the high level, the transistor Tr3 is turned on, and the transistors Tr1 and Tr2 are turned off, so that the DRVOff signal goes to high impedance. As a result, the state in which the latch unit 203 stops the switching of the FET1 is released.

Since the control unit 201 starts operating again from the point of time when the clock signal has stopped (timing (b)), the control signal DRV1 is held at the high level. Therefore, the FET1 is turned on when the clock signal resumes oscillating (timing (c)), undesirably resulting in the hard switching state and generation of surge current ((iii) of FIG. 8). Since the control unit 201 starts operating again from the point of time when the clock signal has stopped (timing (b)), the control signal DRV1 goes to the low level after the clock signal resumes oscillating and a predetermined period then elapses. That is, if the clock signal has not stopped at the timing (b), the control signal DRV1 goes to the low level after the elapse of the period until the timing when the control signal DRV1 falls to the low level (broken line in (i) of FIG. 8).

As described above, according to the present embodiment, even if the clock signal unexpectedly stops during the switching period, the determination unit 202 stops the switching operation of the FET1 based on the STATUS signal representing the status of the control unit 201. The switching operation can therefore be terminated earlier than in the first embodiment. Further, when the control unit 201 returns to the normal state, the determination unit 202 releases the state in which the switching of the FET1 is terminated, whereby the power circuit can return to the normal operation. The output voltage can therefore be held without stopping the power supply from the switching power circuit to a load.

As described above, in the present embodiment, when the clock signal stops, the STATUS signal goes from the high level to the low level. As a result, the latch unit 203 operates in the latch state, so that the gate driving signal DL of the FET1, which is output from the FET driving unit 102, goes to the low level, and the switching operation of the FET1 is terminated, whereby overcurrent flowing through the FET1 is avoided. However, when the clock signal is output, the STATUS signal goes from the low level to the high level, and the latch state of the latch unit 203 is released. At this point, since the control signal DRV1 is held at the high level, the FET1 is turned on when the clock signal resumes oscillating, undesirably resulting in hard switching. To address the problem described above, the timing when the condition transmission unit 231 of the control unit 201 switches the STATUS signal from the low level to the high level is changed from the timing when the clock signal is output to the timing when the clock signal is output and the DRV2 signal is turn on. As a result, the hard switching is avoided so that no surge current occurs in the FET1, and no overcurrent occurs in the FET1, as in the first embodiment.

As described above, according to the present embodiment, the circuit can be protected from overcurrent even when the control unit stops operating, and the output of the power supply voltage to a load is not terminated.

Another Embodiment

Figure 9A:
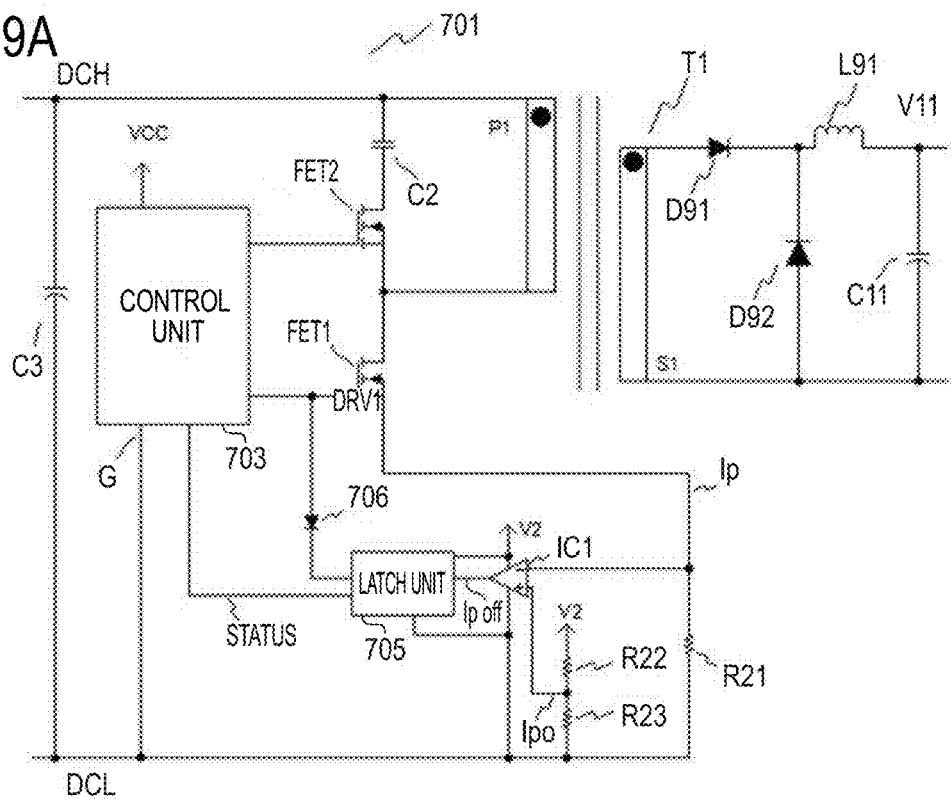
FIG. 9A is a schematic view of a power circuit according to the first embodiment.

The switching power circuits 100 and 200 described in the first and second embodiments are each a power circuit that employs a flyback method. The circuit configuration described above is also applicable to a power circuit that employs a forward method and a switching power circuit that does not employ the active clamp method. FIG. 9A is a circuit diagram illustrating the circuit configuration of an active-clamp switching power circuit 701 using forward voltage on the secondary-side output of the transformer T1. In FIG. 9A, a control unit 703 has the functions of the control unit 201 and the FET driving unit 102 in FIG. 6A in the second embodiment, turns on and off the FET1 and the FET2, and outputs the STATUS signal according to the state of the output clock signal. It is assumed that the timing when the STATUS signal is switched from the low level to the high level is the timing when the clock signal is output and the gate driving signal DH, which drives the FET2, is on. The OCP circuit, which includes the comparator IC1, the voltage dividing resistors R22 and R23, which divide the power supply voltage V2, the current detecting resistor R21, and other components, is the same as the OCP circuit in FIG. 1A in the first embodiment and will not described below. The circuit configuration of a latch unit 705 is not shown and is the same as that of the latch unit 203 illustrated in FIG. 6B in the second embodiment. The IpOff signal from the latch unit 705 in FIG. 9A corresponds to an off signal of the STATUS signal in FIG. 8, and a signal output to the cathode terminal of a diode 706 corresponds to a signal of the DRV signal in FIG. 8. The secondary side of the transformer t1 is provided with diodes D91 and D92, which are each a secondary-side unit that rectifies/smoothens the forward voltage produced in the secondary winding S1 of the transformer T1, the capacitor C11, and a coil L91. FIG. 9A does not show the AC power supply 10, the bridge diode BD1, the start-up circuit 103, the DC/DC converter 104, the feedback unit 115 or other components illustrated in FIG. 1A in the first embodiment and FIG. 6A in the second embodiment.

In the switching power circuit 701, the OCP circuit and the latch unit 705 operate in such a way that the switching operation of the FET1 is terminated even when the clock signal unexpectedly stops during the switching period of the FET1, as in the first and second embodiments. The switching can therefore be safely terminated. Further, after the clock signal resumes normally oscillating, the switching operation can be resumed in synchronization with one of the STATUS signal and the gate driving signal DH of the FET2, whereby the switching operation of the switching power circuit 701 can be resumed without damage of the FET1.

Figure 9B:
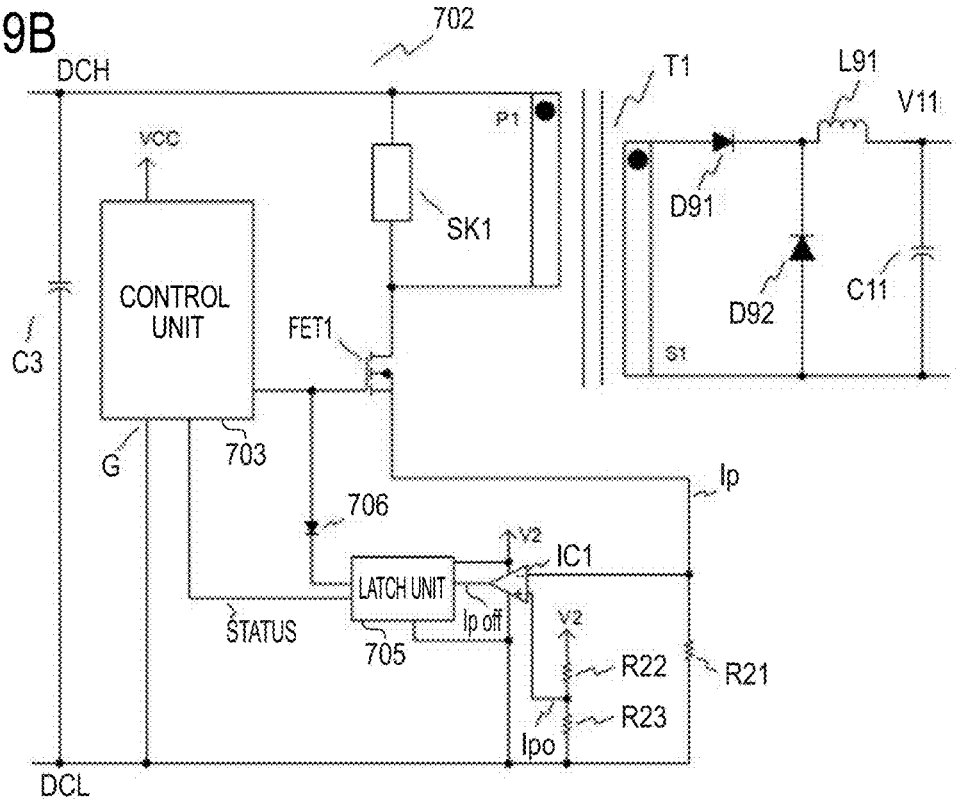
FIG. 9B is a schematic view of a power circuit according to the second embodiment.

FIG. 9B illustrates a switching power circuit 702, which is similar to the switching power circuit 701 in FIG. 9A but differs therefrom in that the active clamp circuit portion is removed but a snubber circuit SKI is added. FIG. 9B illustrates the same circuit configuration as that in FIG. 9A except that the snubber circuit SKI is added and a control unit 704 turns on and off only the FET1, and no description of the circuit configuration illustrated in FIG. 9B will be made. In the switching power circuit 702, the OCP circuit and the latch unit 705 prevent damage of the FET1 due to overcurrent, as in the switching power circuit 701 in FIG. 9A. Further, in the switching power circuit 702, when the clock oscillation unit in the control unit 704 normally outputs the clock signal, the switching operation of the switching power circuit 702 returns to the normal operation.

As described above, also in the other embodiment, the circuit can be protected from overcurrent even when the control unit stops operating, and the output of the power supply voltage to a load is not terminated.

The switching power circuits that are power supply apparatus described in the first and second embodiments are each applicable, for example, as a low-voltage power supply for an image forming apparatus, that is, a power supply that supplies a controller (control unit) and a driving unit, such as a motor, with power. The configuration of an image forming apparatus using the power supply apparatus including either of the switching power circuits according to the first and second embodiments will be described below.

[Configuration of Image Forming Apparatus]

Figure 10:
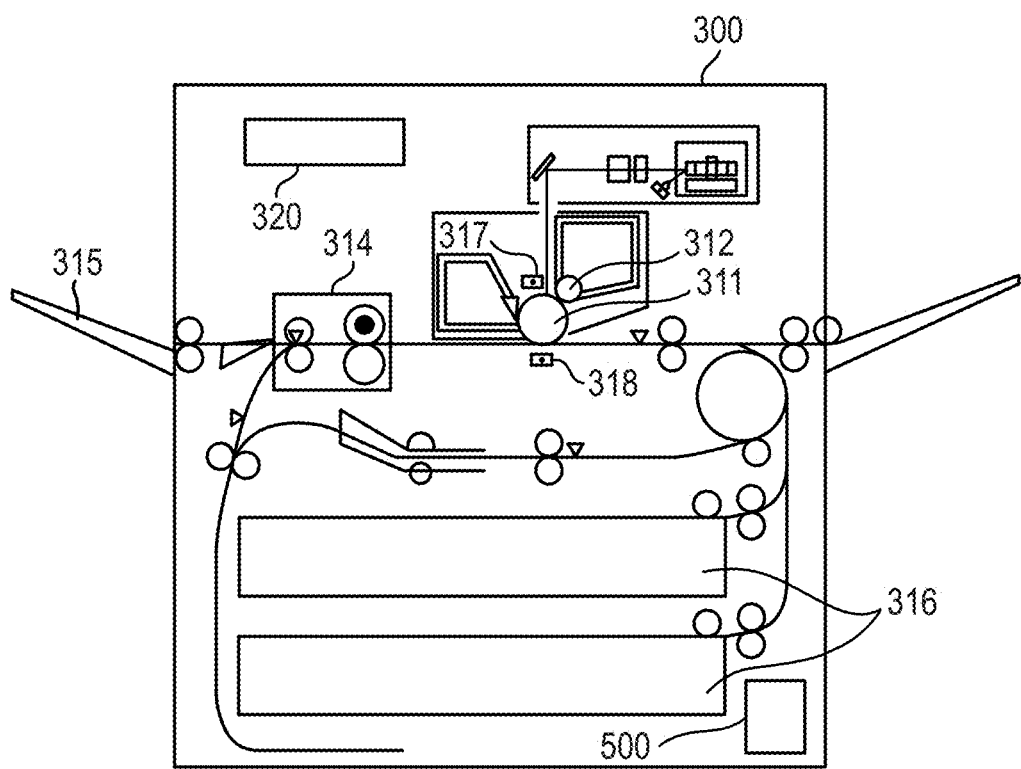
FIG. 10 illustrates an image forming apparatus according to a third embodiment.

As an example of the image forming apparatus, a laser beam printer will be described by way of example. FIG. 10 illustrates a schematic configuration of a laser beam printer, which is an example of an electrophotographic printer. A laser beam printer 300 includes a photosensitive drum 311, which serves as an image carrier on which an electrostatic latent image is formed, a charging unit 317 (charging device), which uniformly charges the photosensitive drum 311, and a developing unit 312 (developing device), which develops the electrostatic latent image formed on the photosensitive drum 311 by using a toner. The toner image developed on the photosensitive drum 311 is then transferred by a transfer unit 318 (transfer device) onto a sheet (not illustrated) as a recording material supplied from a cassette 316, the toner image transferred onto the sheet is fixed by a fixing device 314, and the sheet is ejected onto a tray 315. The photosensitive drum 311, the charging unit 317, the developing unit 312, and the transfer unit 318 form an image forming unit. The laser beam printer 300 further includes a power supply apparatus 500, which includes either of the switching power circuits 100 and 200 described in the first and second embodiments. An image forming apparatus that can use the power supply apparatus 500 is not limited to the apparatus illustrated in FIG. 10 by way of example and may instead, for example, be an image forming apparatus including a plurality of image forming units or an image forming apparatus including a primary transfer unit that transfers the toner image on the photosensitive drum 311 onto an intermediate transfer belt and a secondary transfer unit that transfers the toner image on the intermediate transfer belt onto a sheet.

The laser beam printer 300 includes a controller 320, which controls image formation operation performed by the image forming unit and sheet transport operation, and either of the switching power circuits 100 and 200 described in the first and second embodiments supplies, for example, the controller 320 with power. Either of the switching power circuits 100 and 200 described in the first and second embodiments further supplies power to a driving unit, such as a motor for rotating the photosensitive drum 311 or driving a variety of rollers that transport the sheet.

In the case where the power supply apparatus 500 according to the present embodiment includes the switching power circuit 100 according to the first embodiment, the OCP circuit and the latch unit 105 operate in such a way that the switching operation is terminated even when the clock signal unexpectedly stops during the switching period. The power supply apparatus 500 can therefore be safely caused to stop operating. Further, after the clock signal resumes normally oscillating, the switching can be resumed in synchronization with the control signal DRV2, whereby the power supply apparatus 500 is allowed to return to the normal operation, and the image forming apparatus is subsequently allowed to automatically return to the normal operation.

In the case where the power supply apparatus 500 according to the present embodiment includes the switching power circuit 200 according to the second embodiment, even if the clock signal unexpectedly stops, the determination unit 202 and the STATUS signal, which represents the status of the control unit 201, stop the switching operation. The switching operation of the FET1 can therefore be terminated earlier than in the power supply apparatus 500 including the switching power circuit 100. Further, when the control unit 201 returns to the normal state, the determination unit 202 releases the state in which the switching operation of the FET1 is terminated, whereby the power supply apparatus 500 is allowed to return to the normal operation, and the image forming apparatus is subsequently allowed to automatically return to the normal operation.

As described above, according to the present embodiment, the circuit can be protected from overcurrent even when the control unit stops operating, and the output of the power supply voltage to a load is not terminated.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-138209, filed Jul. 14, 2017, which is hereby incorporated by reference herein in its entirety.

What is claimed is:

1. A power supply apparatus comprising:
a transformer including a primary winding and a secondary winding;
a first switching element connected in series to the primary winding of the transformer;
a second switching element connected in parallel to the primary winding of the transformer;
a capacitor connected in series to the second switching element and connected in parallel along with the second switching element to the primary winding of the transformer;
a feedback unit configured to output information according to voltage induced in the secondary winding of the transformer;
a control unit configured to control turn-on or turn-off of the first switching element by a first control signal and control turn-on or turn-off of the second switching element by a second control signal based on the information output from the feedback unit, the control unit configured to perform a switching operation of alternate turn-on and turn-off of the first switching element and the second switching element before and after a dead time in which the first switching element and the second switching element are both turned off;
a detection unit configured to detect that the power supply apparatus malfunctions; and
a first holding unit configured to turn off the first switching element and holds the first switching element at a turn-off condition,
wherein in a case where the detection unit detects that malfunction occurs, the first holding unit releases the first switching element from the turn-off condition at a timing when the control unit turns on the second switching element by the second control signal.

2. A power supply apparatus according to claim 1, wherein the detection unit comprises a first current detection unit configured to detect current flowing through the first switching element,
wherein the first holding unit, when detecting overcurrent based on a detection result by the first current detection unit, turns off the first switching element, holds the first switching element at the turn-off condition, and releases the first switching element from the turn-off condition at the timing when the control unit turns on the second switching element by the second control signal.

3. A power supply apparatus according to claim 1, wherein the first holding unit holds the first switching element at the turn-off condition by setting the first control signal to turn on the first switching element to be the first control signal to turn off the first switching element.

4. A power supply apparatus according to claim 3, comprising a second current detection unit configured to detect an average value of a current flowing through the first switching element; and a second holding unit configured to turn off the first switching element and the second switching element and holds the first switching element and the second switching element at the turn-off condition when the second holding unit detects overcurrent in the first switching element based on a detection result by the second current detection unit.

5. A power supply apparatus according to claim 4, wherein the second holding unit does not release the first switching element and the second switching element from the turn-off condition.

6. A power supply apparatus according to claim 1, wherein the control unit includes a generation unit configured to generate a clock signal to operate the control unit,
wherein even when the clock signal stops, the generation unit resumes oscillating after a predetermined period elapses to output the clock signal.

7. A power supply apparatus according to claim 1,
wherein the control unit includes a generation unit configured to generate a clock signal to operate the control unit and a detection unit configured to detect the clock signal output from the generation unit stops, and
wherein the detection unit, when detecting that the clock signal stops, outputs a return signal for causing the generation unit to resume oscillating to output the clock signal.

8. A power supply apparatus according to claim 1,
wherein the control unit outputs a condition signal representing a status of the control unit,
wherein the power supply apparatus comprises a detection unit configured to detect the control unit stops operating based on the condition signal output by the control unit, and
wherein the first holding unit turns off the first switching element and holds the first switching element at the turn-off condition when the detection unit detects a stop of an operation of the control unit, and the first holding unit releases the first switching element from the turn-off condition when the condition signal representing the stop of the operation of the control unit is switched to the condition signal representing normal operation of the control unit.

9. A power supply apparatus according to claim 8, wherein the control unit operates based on the clock signal, outputs the condition signal representing the normal operation of the control unit when the clock signal is output, and outputs the condition signal representing the stop of the operation of the control unit when the clock signal stops.

10. A power supply apparatus according to claim 9, wherein the control unit switches the condition signal representing the stop of the operation of the control unit to the condition signal representing the normal operation of the control unit at the timing when the control unit turns on the second switching element by the second control signal.

11. A power supply apparatus according to claim 9,
wherein the control unit includes a generation unit configured to generate the clock signal, and
wherein even when the clock signal stops, the generation unit resumes oscillating after a predetermined period elapses to output the clock signal.

12. A power supply apparatus according to claim 9,
wherein the control unit includes a generation unit configured to generates the clock signal and a detection unit configure to detect the clock signal output from the generation unit stops, and
wherein the detection unit, when detecting the clock signal stops, outputs a return signal for causing the generation unit to resume oscillating to output the clock signal.

13. A power supply apparatus according to claim 1,
wherein the power supply apparatus comprises a first current detection unit configured to detect a current flowing through the first switching element,
wherein the first holding unit, when detecting overcurrent based on a detection result by the current detection unit, turns off the first switching element, holds the first switching element at the turn-off condition,
wherein the power supply apparatus comprises a holding unit configured to turn off the first switching element and holds the first switching element at the turn-off condition when the holding unit detects overcurrent based on a detection result of the detection performed by the current detection unit,
wherein the control unit operates based on the clock signal, outputs the condition signal representing the normal operation of the control unit when the clock signal is output, and outputs the condition signal representing the stop of the operation of the control unit when the clock signal stops, and
wherein the first holding unit releases the first switching element from the turn-off condition when the condition signal representing the stop of the operation of the control unit is switched to the condition signal representing the normal operation of the control unit.

14. A power supply apparatus according to claim 13, wherein the control unit switches the condition signal representing the stop of the operation of the control unit to the condition signal representing the normal operation of the control unit at a timing when the control unit turns on the second switching element by the second control signal.

15. A power supply apparatus according to claim 1, comprising a current detection unit configured to detect a current flowing through the first switching element and the second switching element,
wherein the first holding unit, when detecting overcurrent based on a detection result by the current detection unit, turns off the switching elements, holds the switching elements at the turn-off condition,
wherein the control unit operates based on the clock signal, outputs the condition signal representing the normal operation of the control unit when the clock signal is output, and outputs the condition signal representing the stop of the operation of the control unit when the clock signal stops, and
wherein the holding unit releases the switching elements from the turn-off condition when the condition signal representing the stop of operation of the control unit is switched to the condition signal representing the normal operation of the control unit.

16. An image forming apparatus comprising:
an image forming unit configured to form an image on a recording material; and a power supply apparatus to supply power to the image forming apparatus, the power supply apparatus including;

a transformer including a primary winding and a secondary winding;

a first switching element connected in series to the primary winding of the transformer;

a second switching element connected in parallel to the primary winding of the transformer;

a capacitor connected in series to the second switching element and connected in parallel along with the second switching element to the primary winding of the transformer;

a feedback unit configured to output information according to voltage induced in the secondary winding of the transformer;

a control unit configured to control turn-on or turn-off of the first switching element by a first control signal and control turn-on or turn-off of the second switching element by a second control signal based on the information output from the feedback unit, the control unit configured to perform a switching operation of alternate turn-on and turn-off of the first switching element and the second switching element before and after a dead time in which the first switching element and the second switching element are both turned off;

a detection unit configured to detect that the power supply apparatus malfunctions; and a first holding unit configured to turn off the first switching element and holds the first switching element at a turn-off condition, wherein in a case where the detection unit detects that malfunction occurs, the first holding unit releases the first switching element from the turn-off condition at a timing when the control unit turns on the second switching element by the second control signal.

17. An image forming apparatus according to claim 16, comprising:

a controller configured to control the image forming apparatus; and a driving unit configured to drive the image forming unit, wherein the power supply apparatus supplies power to the controller or the driving unit.

\* \* \* \* \*